(12) United States Patent
Dedic et al.

(10) Patent No.: US 9,432,013 B2
(45) Date of Patent: Aug. 30, 2016

(54) CIRCUITRY USEFUL FOR CLOCK GENERATION AND DISTRIBUTION

(71) Applicant: SOCIONEXT INC., Yokohama-shi, Kanagawa (JP)

(72) Inventors: Ian Juso Dedic, Northolt (GB); David Timothy Enright, Little Totham (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/473,715

(22) Filed: Aug. 29, 2014

(65) Prior Publication Data

US 2015/0070066 A1 Mar. 12, 2015

(30) Foreign Application Priority Data

Sep. 12, 2013 (EP) .................................. 13184038

(51) Int. Cl.
*H04B 3/28* (2006.01)
*H03K 5/15* (2006.01)
*G06F 1/10* (2006.01)
*H01L 49/02* (2006.01)

(52) U.S. Cl.
CPC ............. *H03K 5/1506* (2013.01); *G06F 1/10* (2013.01); *H01L 28/10* (2013.01)

(58) Field of Classification Search
CPC ... H01L 2924/0002; H01F 7/02; H01F 7/021
See application file for complete search history.

(56) References Cited

U.S. PATENT DOCUMENTS

| 2003/0006851 A1 | 1/2003 | Wood |
| 2005/0114820 A1 | 5/2005 | Restle |
| 2007/0145830 A1 | 6/2007 | Lee et al. |
| 2008/0079508 A1* | 4/2008 | Byun et al. ............... H03B 5/06 331/167 |
| 2009/0091362 A1* | 4/2009 | Pellerano ............. H03L 7/0812 327/158 |
| 2009/0302952 A1 | 12/2009 | Chan et al. |
| 2013/0099870 A1* | 4/2013 | Terrovitis ............. H03B 5/1841 331/56 |

FOREIGN PATENT DOCUMENTS

| EP | 1 202 459 B1 | 5/2006 |
| EP | 1 292 035 B1 | 10/2006 |
| EP | 2 019 486 A1 | 1/2009 |
| EP | 2 019 490 A1 | 1/2009 |
| EP | 2 009 795 B1 | 6/2010 |
| EP | 2 019 427 B1 | 9/2010 |
| EP | 2 023 487 B1 | 9/2010 |
| EP | 2 023 489 B1 | 2/2011 |
| EP | 2 211 468 B1 | 7/2011 |
| EP | 2 019 487 B1 | 5/2013 |
| GB | 2 373 654 B | 2/2005 |

OTHER PUBLICATIONS

Extended European Search Report, European Patent Application No. 13184038.1 dated Apr. 3, 2014.

* cited by examiner

*Primary Examiner* — Sibin Chen
(74) *Attorney, Agent, or Firm* — Arent Fox LLP

(57) ABSTRACT

An integrated circuit comprising an inductor arrangement, the arrangement comprising: four inductors adjacently located in a group and arranged to define two rows and two columns, wherein: the integrated circuit is configured to cause two of those inductors diagonally opposite from one another in the arrangement to produce an electromagnetic field having a first phase, and to cause the other two of those inductors to produce an electromagnetic field having a second phase, the first and second phases being substantially in antiphase.

13 Claims, 19 Drawing Sheets

"MINUS"

"MINUS"

"PLUS"

"PLUS"

CIRCUITRY USEFUL FOR CLOCK GENERATION AND DISTRIBUTION

CROSS-REFERENCE TO RELATED APPLICATIONS

This application is based upon and claims the benefit of priority to European Patent Application No. 13184038.1, filed Sep. 12, 2013. The disclosure of the prior application of which is hereby incorporated in its entirety by reference.

The present invention relates to circuitry which may be employed in the generation and supply of clock signals, for example for use in DAC (digital-to-analogue converter) and ADC (analogue-to-digital converter) circuitry.

In particular, the present invention relates to the design/layout of buffers and inductors for use in clock generation paths. Of course, such buffers and inductors could also be employed in applications other than in DAC and ADC circuitry, and for handling signals other than clock signals (e.g. control/data signals). In general, the present invention relates to circuitry and components in which improved matching may be achieved. The present disclosure is to be considered accordingly.

FIG. 1 presents a schematic view of a system 10 in which clock signals are generated and supplied to DAC or ADC circuitry 20. A reference clock signal (e.g. at 2 GHz) is used to generate a differential pair of clock signals (e.g. at 16 GHz) using a PLL (phase lock loop) and/or VCO (voltage controlled oscillator) 30. Further buffer and polyphase filter stages 40 follow to eventually (in an ideal case) output a perfect 4Φ (4-phase) clock signal, e.g. with the phases at 0°, 90°, 180° and 270°, respectively. The output 4-phase clock signal is input to the DAC or ADC circuitry 20, for example to control output/sampler switches (as will be explained in more detail below). The output clock signals may be referred to as clock signals CLK Φ1 to CLK Φ4, being respective phases of the four-phase clock signal, as indicated in FIG. 1.

To provide some context, for example as to how the clock signals CLK Φ1 to CLK Φ4 may be employed, FIGS. 2 to 4 present DAC and ADC circuitry corresponding to the circuitry 20 in FIG. 1.

FIG. 2 is a schematic view of a differential switching circuit 50, which may form part of DAC circuitry 20.

The circuitry 50 comprises a common node CN (or tail node) to which a current source (or, once and for all, sink) is connected. Four transistors SW1 to SW4 are shown connected in parallel (in parallel branches) between the common node CN and a first output node A. Similarly, four transistors SW5 to SW8 are shown connected in parallel between the common node CN and a second output node B. These transistors SW1 to SW8 will be referred to as output switches hereafter, and correspond to the output switches mentioned in connection with FIG. 1.

The gates of the output switches SW1 to SW8 are driven directly by way of clock signals CLK Φ1 to CLK Φ4 as indicated, although a buffer or decoupling capacitor may be provided along the clock paths to the gates (not shown). Data-controlled switches D1 to D8 are provided in series connection with the output switches SW1 to SW8, respectively. Data-controlled switches D1 to D8 are driven by respective data signals as shown and described below.

It is advantageous to drive the gates of the output switches directly with clock signals, provided that good control can be had of the signals which arrive at those gates.

Looking at FIG. 2, each output switch SW1 to SW8 effectively is one of a pair of series-connected switches (in this case, field-effect transistors). These switches may be implemented as NMOS field-effect transistors.

The clock signals CLK Φ1 to CLK Φ4 are substantially sinusoidal in the present example. Effectively, four time-interleaved sinusoidal clock signals are provided.

The overall operation of the FIG. 2 circuitry is that the output switches SW1 to SW8 and the data-controlled switches D1 to D8 are driven so as, in use, to steer current from the current source through the first output node A or the second output node B in dependence upon the value (digital 0 or 1) of the data signals DATA1 to DATA4, which are shown as being applied to the data-controlled switches D1 to D8.

In order to achieve this, output switches SW1 and SW5 are provided with clock signal CLK Φ1, SW2 and SW6 are provided with clock signal CLK Φ2, SW3 and SW7 are provided with clock signal CLK Φ3, and SW4 and SW8 are provided with clock signal CLK Φ4. Moreover, data-controlled switches D1 and D5 are respectively provided with data signals DATA 1 and $\overline{DATA1}$, D2 and D6 are respectively provided with DATA 2 and $\overline{DATA2}$, D3 and D7 are respectively provided with DATA 3 and $\overline{DATA3}$, and D4 and D8 are respectively provided with DATA 4 and $\overline{DATA4}$.

The effect of the 4-phase clock signal is that either output switch SW1 or SW5 carries a current pulse in a first clock cycle or phase (Φ1), dependent on the value of the data signal DATA 1. Similarly, dependent on data, SW2 or SW6 carries a current pulse in a second clock cycle or phase (Φ2), SW3 or SW7 carries a current pulse in a third clock cycle or phase (Φ3) and SW4 or SW8 carries a current pulse in a fourth clock cycle or phase (Φ4). The output switches in FIG. 2 are NMOS transistors, and as such turn on in the +ve peak portions of the relevant clock signals.

Accordingly, for each clock cycle, if the value of the data signal concerned is 1 the current $I_{TAIL}$ is steered through node A and if it is zero through node B. Moreover, in each cycle two transistors (of the output switches) turn on and two turn off, irrespective of the data.

Given the example 16 GHz, 4-phase clock signal depicted in FIG. 3, it will be appreciated that this operation leads to an overall sample rate of 64 Gs/s.

Output nodes A and B are connected to the output switches via respective output cascodes as indicated in FIG. 2. A differential analogue output signal of the switching circuitry (corresponding to the input digital data) may thus be measured between the two output terminals, as a current signal or as a voltage signal by way of terminating resistors (not shown).

Looking at each pair of series-connected switches in FIG. 2 as a single unit, in any particular cycle or state 1 is off and 7 are on. Looking at the upper switches (the output switches) of each pair, in any state 2 are on and 6 are off. Looking at the lower switches (the data-controlled switches) of each pair, in any state (ignoring transitional changes of the data values, which in an ideal case would be instantaneous) 4 are on and 4 are off.

Moreover, looking at each pair as a single unit, from one cycle to the next 1 turns on and 1 turns off. Looking at the upper switches (the output switches) of each pair, from one cycle to the next 2 turn on and 2 turn off. Looking at the lower switches (the data-controlled switches) of each pair, from one cycle to the next either the same number turn on as turn off (if the data changes) or the switches retain their states (if the data stays the same).

Looking further at FIG. 2, the circuitry portion comprising output switches SW1 to SW8 may be referred to as clock-controlled circuitry 52, and the circuitry portion comprising data-controlled switches D1 to D8 may be referred to as data-controlled circuitry 54. It will be appreciated that the switches in the clock-controlled circuitry 52 are controlled by clock signals and not by data signals, and as such they may be considered data-independent. Conversely, the switches in the data-controlled circuitry 54 are controlled by data signals and not by clock signals, and as such they may be considered clock-independent. For example, the clock signals CLK Φ1 to CLK (D4 may be supplied continuously (i.e. during active operation) to the clock-controlled circuitry 52 and specifically to the gates of the output switches SW1 to SW8 (field-effect transistors).

To demonstrate the importance of the clock signals CLK Φ1 to CLK Φ4, reference may be made to FIG. 4.

FIG. 4 presents waveforms for the clock signals CLK $\Phi_1$ to $\Phi_4$ in the upper graph, and partial waveforms for the currents received at output nodes A and B, labeled as $IOUT_A$ and $IOUT_B$, in the lower graph, for use in better understanding the operation of differential switching circuit 50 of FIG. 2.

As mentioned above, clock signals CLK $\Phi_1$ to $\Phi_4$ are time-interleaved raised (substantially) cosine waveforms and are 90° out of phase with one another. The clock signals shown are sinusoidal, but need not be strictly-perfect sinusoids. As will become apparent, in the present embodiment the shape of the waveforms is more important in the uppermost part than towards the bottom.

As an aside, the number of clock signals shown in FIGS. 3 and 4 is related to the number of parallel paths to each of nodes A and B in FIG. 2. Since there are four parallel paths to each of nodes A and B in FIG. 2, four time-interleaved clock signals are provided, 90° out of phase with one another. It is envisaged that where X parallel paths to each of nodes A and B are provided, X time-interleaved clock signals may be provided, (360/X)° out of phase with one another. In this case, X is an integer greater than or equal to 2, and preferably greater than or equal to 3, and more preferably equal to 4.

Returning to FIG. 4, for the benefit of further explanation clock signal $\Phi_4$ is highlighted in bold.

Clock signals CLK $\Phi_1$ to $\Phi_4$ control the gates of output switches SW1 to SW8, as already described in connection with FIG. 2. Accordingly, the output-switch pairs (where the pairs are SW1/SW5, SW2/SW6, SW3/SW7, SW4/SW8) are turned on and then off in sequence, such that as one of them is turning off the next in sequence is turning on, and such that when one of them is turned fully on the others are substantially turned off. As mentioned before, which switch of such an output-switch pair carries a current pulse when the pair is turned on is dependent on the data signal (of DATA 1 to DATA 4) concerned.

The differential switching circuit 50 of FIG. 2 effectively operates in current-mode, steering current $I_{TAIL}$ between the available paths. Because substantially all current passing through the common node via switches SW1 to SW8 must equal current $I_{TAIL}$, then the sum of currents flowing through nodes A and B at any time must be substantially equal to $I_{TAIL}$. The effect of the data-controlled switches D1 to D8 mentioned above is therefore that current $I_{TAIL}$ is steered to pass through one switch from each output-switch pair in the sequence in which those output-switch pairs are turned on and off, i.e. such that as one of the output-switch pairs is turning off and thus one of its output switches starts to carry less of $I_{TAIL}$, the next output-switch pair in sequence is turning on and thus one of its output switches starts to carry more of $I_{TAIL}$, and such that when one of the output-switch pairs is turned fully on, one of its output switches carries substantially all of $I_{TAIL}$ because the other output switch of that pair has its series-connected data-controlled switch substantially turned off and because the output switches of the other output-switch pairs are substantially turned off.

This effect is shown in the lower graph of FIG. 4. Only three output currents for clocks CLK $\Phi_3$, $\Phi_4$ and $\Phi_1$ are shown for simplicity, however the pattern of waveforms shown (in the sense of their shape) continues with the successive peaks being for $IOUT_A$ or $IOUT_B$ dependent on the data. In the present example, it is assumed that the data sequence is DATA 3=0 (such that the current passes to node B), DATA 4=1 (such that the current passes to node A), and DATA 1=0 (such that the current passes to node B). For comparison with the upper graph of clock signals, the waveform for the output current corresponding to clock signal $\Phi_4$ is highlighted in bold.

In order to gain a better understanding of the lower graph in FIG. 4, three points, 60, 62 and 64 are indicated on waveform $\Phi_4$ and a corresponding three points 70, 72 and 74 are indicated on the corresponding current waveform.

At point 60, waveform CLK $\Phi_4$ is at its peak value, i.e. at $V_{DD}$, and the other clock signals CLK $\Phi_1$ to $\Phi_3$ are significantly below their peak value. Accordingly, (given DATA 4=1) switches SW4 and SW8 are fully on with D4 on and D8 off, and at least the other output switches (SW1 to SW3 and SW5 to SW7) are substantially off. Therefore, at the corresponding point 70, current $IOUT_A$ is equal to $I_{TAIL}$ and current $IOUT_B$ is substantially equal to zero.

At point 62, which precedes point 60, waveform $\Phi_4$ is rising towards its peak value but has not yet reached its peak value. Also, at point 79, waveform $\Phi_3$ is falling from its peak value. Importantly, at point 62 clock signals $\Phi_3$ and $\Phi_4$ have equal values. Therefore switches SW3 and SW4, and also SW7 and SW8 are on to the same extent as one another, because their source terminals are connected together. At point 62, clock signals $\Phi_1$ and $\Phi_2$ are also equal to one another and are sufficiently low to ensure that switches SW1 and SW2, and also SW5 and SW6, are off. Thus, at this point in time, half of current $I_{TAIL}$ flows through switches SW4 and D4 (given DATA 4=1) and half of it flows through switches SW7 and D7 (given DATA 3=0), as indicated by point 72, such that $IOUT_B=IOUT_A=(I_{TAIL})/2$.

Point 64 is equivalent to point 62, except that at this point it is switches SW4 and SW1, and also SW8 and SW5 that are on. Therefore, at corresponding point 74, $IOUT_A=IOUT_B=(I_{TAIL})/2$.

It will therefore be appreciated that the three points for each current waveform (e.g. points 70, 72 and 74 for current waveform $IOUT_A$ in FIG. 4) are fixed or defined in time relative to the clock waveforms and in magnitude relative to the current $I_{TAIL}$. That is, taking current $IOUT_A$ as an example, at point 70 the current is equal to $I_{TAIL}$ and at points 72 and 74 the current is equal to half $I_{TAIL}$. The location of points 70, 72 and 74 is fixed relative to the clock signals $\Phi_1$ to $\Phi_4$. The same is true for the subsequent current signal pulses or charge packets, which may be for $IOUT_A$ or $IOUT_B$ dependent on the data. The focus on points 60, 62 and 64 demonstrates that the upper part of the clock signals is important, and that the lower parts are less important (such that, for example, the precise shape of the lower parts is not strictly critical).

Thus, the series of current pulses of waveforms (for $IOUT_A$ or $IOUT_B$ dependent on the data) are all of the same shape, and that shape is defined by the raised cosine shape of the clock signals.

Incidentally, it will be appreciated that in order to determine whether any particular current pulse in the lower half of the FIG. is of $IOUT_A$ or $IOUT_B$ the data value concerned should be stable in time to create the pulse concerned. For example, in the case of the bold current signal of FIG. 4, which corresponds to clock signal CLK $\Phi_4$, the relevant data signal DATA 4 should be stable at least over the period of time spanning the five vertical dashed lines. For example, data signal DATA 4 could be arranged to change state at or approximately at the troughs (negative peaks) of clock signal CLK $\Phi_4$. Similarly, each of data signals DATA 1 to DATA 3 could be arranged to change state at or approximately at the troughs of their respective clock signals CLK $\Phi_1$ to $\Phi_3$. Thus, in the running example of 16 GHz clock signals as in FIG. 3, the data signals DATA 1 to DATA 4 may also be 16 GHz signals configured to change state at or approximately at the troughs of their respective clock signals.

For the present purposes the point to note is that the accuracy of the clock signals CLK $\Phi_1$ to $\Phi_4$ directly affects the accuracy of the current pulses in the lower part of FIG. 4, and as a result the accuracy of the overall DAC circuitry.

FIG. 5 presents sampling circuitry 80, which may form part of ADC circuitry 20.

FIG. 5 corresponds to FIG. 10 of EP-A1-2211468, to which reference may now be made. In FIG. 5, the point to note is that sampling switches SW1 to SW8 correspond to output switches SW1 to SW8 of FIG. 2, and that clock signals CLK Φ1 to Φ4 also correspond to clock signals CLK Φ1 to Φ4 of FIGS. 2 to 4. Moreover, the relative importance of the uppermost parts of the clock signals CLK Φ1 to Φ4 explained in connection with FIG. 3 also applies to the sampling circuitry 80 of FIG. 5, as explained in FIG. 12 of EP-A1-2211468. A detailed understanding of the sampling circuitry 200 can be found in EP-A1-2211468.

Again, for the present purposes the point to note is that the accuracy of the clock signals CLK $\Phi_1$ to $\Phi_4$ directly affects the accuracy of the current pulses in the lower part of FIG. 4, which applies analogously to the sampling circuitry 80 of FIG. 5, and as a result affects the accuracy of the overall ADC circuitry.

Returning to FIG. 1, many buffer stages may occur along the clock generation path (although shown collectively as element 40). An example buffer stage 100 is indicated in FIG. 6, in the left-hand part of the FIG.

Each buffer stage 100 comprises one or more buffers per channel CH1 to CH4, where each channel carries a different phase (Φ) of the 4Φ clock signal. Thus, CH1 carries CLK Φ1 of phase 1, CH2 carries CLK Φ2 of phase 2, CH3 carries CLK Φ3 of phase 3 and CH4 carries CLK Φ4 of phase 4. The buffer stage 100 comprises two buffers 102 per channel, arranged into two parallel sets 104 of four buffers. Such buffers and buffer stages (and buffer circuitry) may be considered to be circuitry which provides electrical impedance transformation from one circuit to another.

Each polyphase filter stage may also comprise one or more such buffer stages 100 of parallel sets 104 of buffers 102. The polyphase filter stage 110 (which may represent part of a polyphase filter stage) presented in the middle part of FIG. 6 comprises a parallel set 104 of buffers 102, along with an RC network 112 comprising series resistances 114 per channel, and capacitances 116 coupling adjacent channels.

A typical known buffer circuit 120, corresponding to buffer 102, is presented in the right-hand part of FIG. 6. Buffer circuit 120 is essentially a CMOS inverter, comprising NMOS and PMOS field-effect transistors (FETs) coupled as shown.

FIG. 7 indicates that several buffer/polyphase-filter stages may be provided in series to bring the 4 phases (Φ) on the respective channels CH1 to CH4 towards the ideal case. That is, in each successive stage the phase angles come closer towards an ideal case of 0°, 90°, 180° and 270°.

At the very high speed of operation adopted by the DAC circuitry 50 and ADC circuitry 80 shown in FIGS. 2 and 5, e.g. with 16 GHz clocks, it is very difficult to obtain ideal 4-phase clock signals CLK Φ1 to Φ4. For example, a 1° error at 16 GHz represents a delay of a mere 174 fs, i.e. approximately 200 fs. It is recalled from FIG. 4 that accuracy in the clock signals has a direct impact on the performance of the DAC and ADC circuitry.

Known buffer circuitry 120 as shown in FIG. 6 on the right-hand side is not sufficiently accurate (when using multiple such buffers 102 together, particularly in parallel set 104). In particular, random $V_{TH}$ (threshold voltage) variation in the NMOS and PMOS field-effect transistors (FETs) of the buffer circuitry lead to variations in the switching delays and thus performance of the buffers 102. This $V_{TH}$ (threshold voltage) variation is a variation in the sense that one such transistor may have a different threshold voltage from the next, both across process (e.g. from chip to chip) and within the same process (e.g. within the same chip).

It is desirable that the parallel set of buffers 104 across the four channels be delay-matched to better than 100 fs, to enable sufficiently accurate operation when using 16 GHz clocks. This is a significant design factor. For example, looking at the example known buffer circuit 120 in FIG. 6, the transistors need to be very small (low-power) high-speed transistors to carry such 16 GHz clock signals, and at such sizes the variation in threshold voltage $V_{TH}$ (both across process and also within the same process) is significant and causes too much variation in delay between buffers.

As will become apparent later herein, it is also desirable to provide improved inductors which, although they may be used in other circuitry, are suitable for use in such buffer circuitry in which a high degree of matching is desired. It has been found, again as described later herein, that existing inductors detrimentally affect matching performance.

It is desirable to solve some or all of the above problems.

According to a first aspect of the present invention, there is provided buffer circuitry, comprising: a switching arrangement comprising at least one signal-path switch configured to switch in dependence upon an input signal, and operable to output an output signal based on such switching, the switching of each said signal-path switch affecting the output signal; and a current-control arrangement, wherein: the switching performance of the buffer circuitry is dependent on a bias current which flows through each said signal-path switch of the switching arrangement; and the current-control arrangement is connected to the switching arrangement and configured to (control or) define the bias current which flows through (at least one or) each said signal-path switch so as to control the switching performance of the buffer circuitry.

The input signal may be a switched-logic signal such as a digital signal, or an analogue signal such as a sinusoidal signal.

Such signal-path switches may be in the path between the input and output signals, in the sense that their switching is controlled by the input signal (e.g. directly) and in the sense that their switching affects the magnitude of the output signal directly. For example, the buffer circuitry may have an output at which the output signal is produced, and each signal-path switch may be directly or indirectly connected to that output.

The switching performance of the circuitry may be defined by switching delays of the or each signal-path switch. The present invention advantageously enables the switching performance of the buffer circuitry to be matched with (e.g. made similar to or the same as, or brought within a close range of) a given performance, which may be that of another set of buffer circuitry. For example, the present invention may enable improved matching between plural sets of such buffer circuitry. The present invention may enable such matching to be achieved despite the phenomenon of threshold voltage variation in such switches (e.g. field-effect transistors).

The current-control arrangement may be configured to individually define the bias current which flows through (at least one or) each said signal-path switch. The current-control arrangement may be configured to define the bias current which flows through (at least one or) each said signal-path switch substantially independently of a difference between a threshold voltage of that switch and a reference threshold voltage.

The switching arrangement may comprise at least two signal-path switches. The current-control arrangement may be configured to define the bias current which flows through (at least one or) each of those signal-path switches substantially independently of a difference between a threshold voltage of that switch and a corresponding reference threshold voltage, and/or substantially independently of a difference between threshold voltages of those switches.

The current-control arrangement may be configured such that a range in which each said bias current is expected to lie is narrower than if said current-control arrangement were not provided. That is, the current-control arrangement may be inherently easier to match (with a given current-control arrangement) than is said signal-path switch (with a given signal-path switch).

For example, the current-control arrangement may be configured such that a range in which each said bias current is expected to lie is N times narrower than if said current-control arrangement were not provided, where 1<N≤20, and optionally where 2≤N≤5.

The current-control arrangement may comprise at least one current-control switch, such switches being configured to define the bias current which flows through (at least one or) each said signal-path switch.

Such current-control switches may be non-switching switches, in the sense that they are not switched based on the input signal. As such, they may be considered to be out of the signal path, and instead control the operation of the signal-path switches. Such current-control switches may serve as part or all of current sources or sinks.

The size of the or each current-control switch may be large as compared to the size of the or each signal-path switch, such that a range in which each bias current is expected to lie is narrower than if the current-control arrangement were not provided. Larger switches may be easier to match (in terms of threshold voltage) than smaller switches.

For example, the size of the or each current-control switch may be X times larger than the size of the or each signal-path switch, where 2≤X≤1000, and preferably where 10≤X≤500, and more preferably where 80≤X≤150.

The or each switch may be a field-effect transistor. The size of such switches may be defined by their gate area, or by one or both of the length and width of their channels.

The switching arrangement may comprise at least two signal-path switches, and those two signal-path switches may be PMOS and NMOS field-effect transistors configured as a CMOS inverter having an input at which said input signal is received and an output at which the output signal is output.

In one such case, the current-control arrangement may comprise a PMOS field-effect transistor, being a current-control switch, and that PMOS field-effect transistor may be connected in series with the PMOS field-effect transistor of the inverter so as to define the bias current which flows through the PMOS field-effect transistor of the inverter.

In another case, the current-control arrangement may comprise an NMOS field-effect transistor, being a current-control switch, and that NMOS field-effect transistor of the current-control arrangement may be connected in series with the NMOS field-effect transistor of the inverter so as to define the bias current which flows through the NMOS field-effect transistor of the inverter.

In either such case, the input and output of the inverter may be coupled together via a resistor, the input may be connected to receive the input signal via a decoupling capacitor, and a node between the field-effect transistor of the current-control arrangement and the inverter may be coupled to a reference voltage via a capacitor. This may enable the field-effect transistor of the current-control arrangement to define the bias currents which flow through both the PMOS and NMOS field-effect transistors of the inverter.

In another example having a CMOS inverter and a PMOS current-control switch as mentioned above, the current-control arrangement may comprise an NMOS field-effect transistor, being a current-control switch, the NMOS field-effect transistor of the current-control arrangement may be connected in series with the NMOS field-effect transistor of the inverter so as to define the bias current which flows through the NMOS field-effect transistor of the inverter, and each of the NMOS and PMOS field-effect transistors of the current-control arrangement may be coupled at a node between itself and the inverter transistors to a reference voltage via a capacitor. This may enable the field-effect transistors of the current-control arrangement to define the bias currents which flow through both the PMOS and NMOS field-effect transistors of the inverter.

Such buffer circuitry may comprise a reactance coupled to the input and/or output of the inverter and configured so as to control the frequency response of the buffer circuitry. The reactance may comprise an inductor and/or a capacitor, optionally wherein either or both of them are tuneable, optionally by switching in or out inductors/capacitors. Such an inductor may be an inductor arrangement as in the seventh or eighth aspect described below.

The switching arrangement may comprise at least two signal-path switches being transistors, and the current-control arrangement may comprise at least one current-control switch for each signal-path switch, each connected to define the bias current which flows through its signal-path switch. For example, each signal-path may be provided with its own current source or sink. In such a case, the at least two signal-path switches may be field-effect transistors of the same channel type.

According to a second aspect of the present invention, there is provided buffer circuitry, comprising: a CMOS inverter comprising PMOS and NMOS field-effect transistors, and operable to receive an input signal and output an output signal based on switching of those PMOS and NMOS field-effect transistors in response to that input signal; and a PMOS field-effect transistor configured to act as a current-control switch and connected in series with the PMOS field-effect transistor of the inverter so as to define a bias current which flows through the PMOS field-effect transistor of the inverter; and an NMOS field-effect transistor configured to act as a current-control switch and connected in series with the NMOS field-effect transistor of the inverter so as to define a bias current which flows through the NMOS field-effect transistor of the inverter.

The size of the field-effect transistors configured to act as current-control switches may be large as compared to the size of the field-effect transistors of the inverter.

In either of the aforementioned first and second aspects, the or each bias current may be an average current or an effective DC current.

In either of the aforementioned first and second aspects, the input signal may be a high-speed signal, and the or each current-control switch may be controlled by a low-speed signal.

In either of the aforementioned first and second aspects, the input signal may cause the, or each signal-path switch to switch so as to define signal transitions in said output signal, and the or each current-control switch may be controlled by a signal which tunes or biases the performance or gain of that switch rather than causes it to switch.

In either of the aforementioned first and second aspects, the or each current-control switch may be configured as a non-switching switch, to act as part or all of a current source or sink.

Buffer circuitry of either of the aforementioned first and second aspects may comprise an inductor arrangement as in the seventh or eighth aspect described below.

According to a third aspect of the present invention, there is provided signal distribution circuitry, comprising a plurality of sets of buffer circuitry according to either of the aforementioned first and second aspects.

According to a fourth aspect of the present invention, there is provided signal distribution circuitry, comprising: first buffer circuitry according to either of the aforementioned first and second aspects; and second buffer circuitry according to either of the aforementioned first and second aspects, wherein: the switching arrangement of the second buffer circuitry is configured in the same way as the switching arrangement of the first buffer circuitry; and the current-control arrangement of the second buffer circuitry is configured in the same way as the current-control arrangement of the first buffer circuitry, so as to tend to cause the switching performance of the second buffer circuitry to be the same as the switching performance of the first buffer circuitry.

The second buffer circuitry may be connected so as to receive as its input signal the output signal of the first buffer circuitry. As another option, respective input signals of the first buffer circuitry and the second buffer circuitry may be different clock signal phases of a multi-phase time-interleaved clock signal.

According to a fifth aspect of the present invention, there is provided analogue-to-digital converter circuitry or digital-to-analogue converter circuitry, comprising buffer circuitry according to either of the aforementioned first and second aspects, or signal distribution circuitry according to either of the aforementioned third and fourth aspects.

According to a sixth aspect of the present invention, there is provided an integrated circuit or an IC chip comprising circuitry according to any of the aforementioned first to fifth aspects.

According to a seventh aspect of the present invention, there is provided an integrated circuit comprising an inductor arrangement, the arrangement comprising: four inductors adjacently located in a group and arranged to define two rows and two columns, wherein: the integrated circuit is configured to cause two of those inductors diagonally opposite from one another in the arrangement to produce an electromagnetic field having a first phase, and to cause the other two of those inductors to produce an electromagnetic field having a second phase, the first and second phases being substantially in antiphase.

Such inductors may be discrete inductors, i.e. distinct from one another even if they are connected together. The rows and columns may be regularly or irregularly arranged. For example, the rows may be perpendicular to the columns. The spacing between the inductors may be regular (e.g. defining a regular grid or array) or irregular. The inductors may have the same dimensions as one another, or different dimensions. The inductors may be formed on the same layer or layers of the integrated circuit as one another, or on different layers. The direction of turns of the inductors may be the same as one another, or different. The width and length of the tracking which makes up the inductors may be the same for all of the inductors, or there may be differences.

The first and second phases may be stable or may shift, while remaining (at least mainly or for particular periods) in antiphase.

Such integrated circuitry may be advantageous in that the inductor arrangement has little or no or negligible impact (in the sense of electromagnetic interference) on surrounding circuitry such as other inductors.

The integrated circuitry may have one or more layers, e.g. metal layers, wherein each inductor is formed in only one such layer or across a plurality of such layers. The inductors may each have one or more turns, and may be spiral inductors. The inductors may have the same size and number of turns as one another.

The direction of the turns of the inductors may be configured so that they produce their respective electromagnetic fields. The inductors may be connected to other circuitry of the integrated circuit and/or to each other so that they produce their respective electromagnetic fields.

The inductors may be immediately adjacently located, for example such that no other circuitry components are located between those inductors.

A spacing between effective centres of the inductors may be Z times an effective diameter of at least one of the inductors, where $1 \leq Z \leq 50$, and preferably where $1 \leq Z \leq 10$, and more preferably where $2 \leq Z \leq 5$. An effective centre may be the centre of a circle which is defined by an outer periphery of an inductor, when viewed in plan view.

The arrangement may comprise sixteen inductors including said four inductors. In such an arrangement, the inductors may be arranged to define four rows and four columns, and be configured so that each of them produces an electromagnetic field having the first phase or the second phase. Moreover, for any adjacent group of four of the sixteen inductors spanning two rows and two columns, diagonally opposite inductors may produce electromagnetic fields having the same phase as one another.

The group of the arrangement may comprise any number of inductors greater than four.

The electromagnetic fields may be fluctuating or alternating fields, for example with a predominant centre frequency (or characteristic frequency). The electromagnetic fields may have the same centre frequency or characteristic frequency.

The inductors of the arrangement may be connected together to form or act as a single inductor or two separate inductors. That is, the inductors of the arrangement may be conductively connected together, or pairs of them may be conductively connected together, the pairs themselves not being conductively connected to one another. The inductors of the arrangement may be connected to different circuits, and not be conductively connected together.

Such an integrated circuit may comprises first and second such inductor arrangements, wherein: the first and second phases of the first inductor arrangement are substantially in quadrature with the first and second phases, respectively, of the second inductor arrangement. Such an integrated circuit may be adapted to handle four clock signals being the four phases of a four-phase clock signal. For example, such an integrated circuit may comprise buffer circuitry adapted to receive and buffer four clock signals being the four phases of a four-phase clock signal, wherein: the first and second inductor arrangements are connected to the buffer circuitry such that their electromagnetic fields are generated from respective ones of those clock signals.

The or each inductor arrangement may define associated null lines along which its effective electromagnetic field has zero or negligible field strength. That is, along such lines the combination of the electromagnetic fields produced by the inductors may have zero or negligible field strength. In the above case with first and second inductor arrangements, each may be located substantially along one of the other's null lines.

Such first and second inductor arrangements and the buffer circuitry may form a first clock distribution unit.

In such a case, the integrated circuit may comprise a second such clock distribution unit, and the first and second clock distribution units may be connected such that the clock signals having been buffered by the buffer circuitry of the first clock distribution unit are the clock signals received by the buffer circuitry of the second clock distribution unit.

Each inductor arrangement may define associated null lines along which its effective electromagnetic field has zero or negligible field strength, the first and second inductor arrangements of the first clock distribution unit may each be located substantially along one of each other's null lines, the first inductor arrangements of the first and second clock distribution units may each be located substantially along one of each other's null lines, and the second inductor arrangements of the first and second clock distribution units may each be located substantially along one of each other's null lines.

According to an eighth aspect of the present invention, there is provided an integrated circuit comprising an inductor arrangement, the arrangement comprising: a plurality of (optionally spiral) inductors adjacently located in rows and columns, wherein: the inductors are connected so as to produce an electromagnetic field having a first or second phase, the first and second phases being substantially in antiphase; and adjacent inductors in said one or more rows or columns produce electromagnetic fields having different said phases. The plurality may be a group of four. The number of rows and columns may be equal.

An integrated circuit according to the aforementioned seventh or eighth aspect of the present invention may comprise analogue-to-digital converter circuitry and/or digital-to-analogue converter circuitry.

An integrated circuit according to the aforementioned seventh or eighth aspect of the present invention may comprise buffer circuitry according to either of the aforementioned first and second aspects, or signal distribution circuitry according to either of the aforementioned third and fourth aspects.

According to a ninth aspect of the present invention, there is provided an IC chip comprising an integrated circuit according to the aforementioned seventh or eighth aspect of the present invention.

The present invention extends to method aspects corresponding in scope with the aforementioned aspects of the present invention.

Reference will now be made, by way of example, to the accompanying drawings, of which:

FIG. 1, as described hereinabove, presents a schematic view of a system in which clock signals are generated and supplied to DAC or ADC circuitry;

FIG. 2, as described hereinabove, is a schematic view of a differential switching circuit which may form part of the DAC circuitry of FIG. 1;

FIG. 3, as described hereinabove, is a graph representing an example 16 GHz, 4-phase clock signal;

FIG. 4, as described hereinabove, presents waveforms for clock signals CLK $\Phi_1$ to $\Phi_4$ in its upper graph, and partial waveforms for currents received at output nodes A and B in its lower graph, for use in better understanding the operation of the differential switching circuit of FIG. 2;

FIG. 5, as described hereinabove, is a schematic view of sampling circuitry which may form part of the ADC circuitry of FIG. 1;

FIG. 6, as described hereinabove, is a schematic diagram presenting example buffers, buffer stages and polyphase filter stages;

FIG. 7, as described hereinabove, is a schematic diagram indicating that several buffer/polyphase-filter stages may be provided in series in a clock generation and distribution path;

Figure 8A:
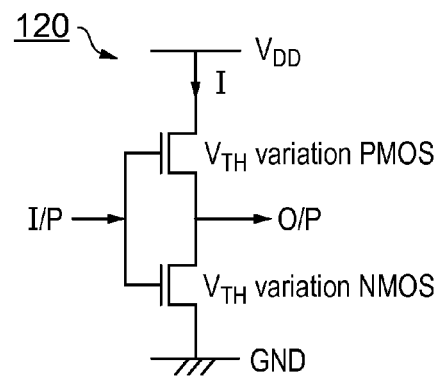
FIG. 8A is a schematic diagram presenting buffer circuitry of FIG. 6, and useful for understanding its operation.
Figure 8A:
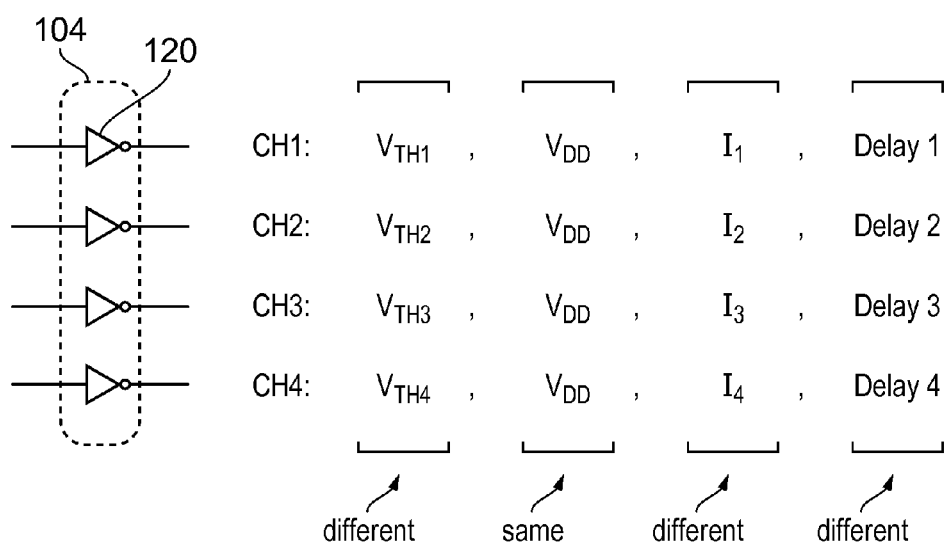
Figure 8B:
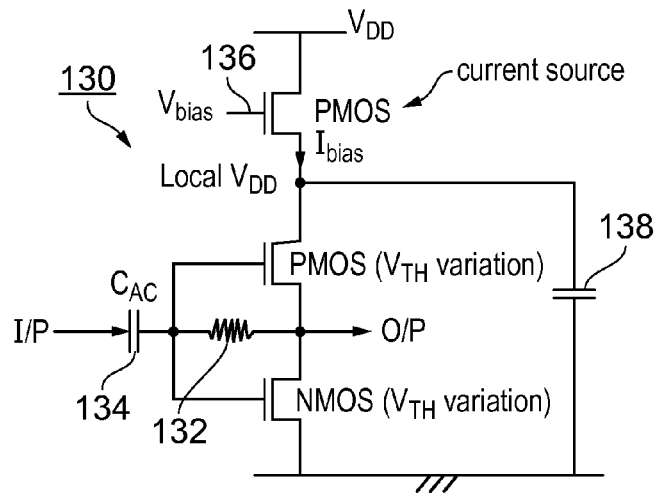
FIG. 8B is a schematic diagram presenting buffer circuitry embodying the present invention, and useful for understanding its operation.
Figure 8B:
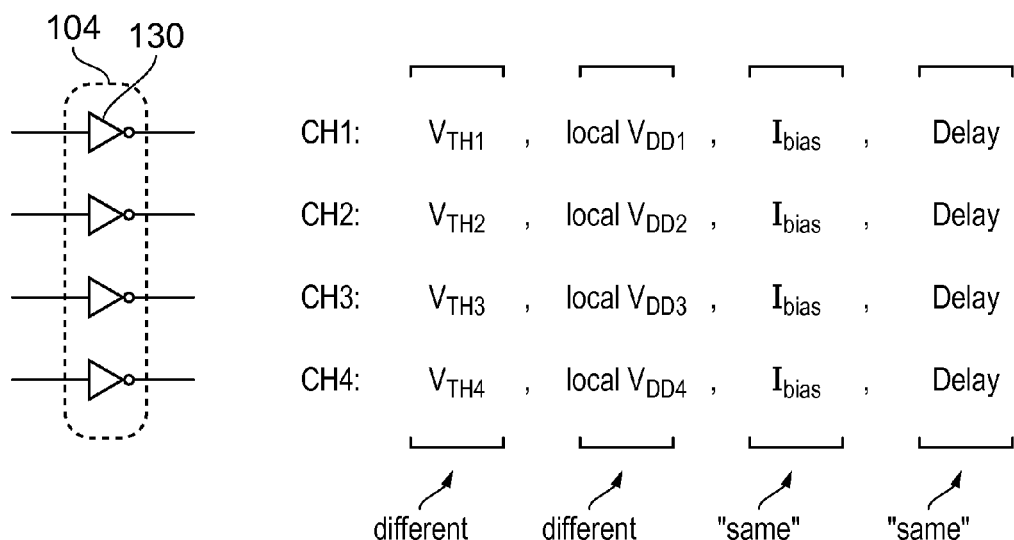
Figure 10:
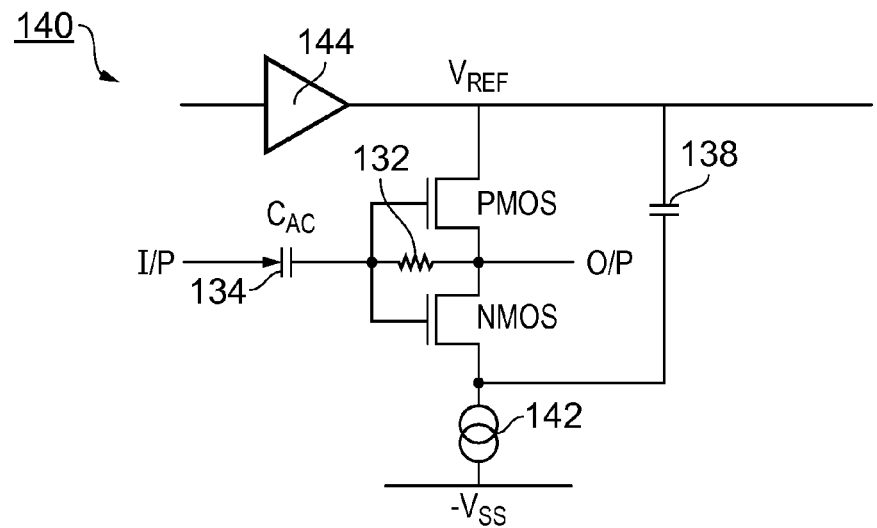
Figure 10:
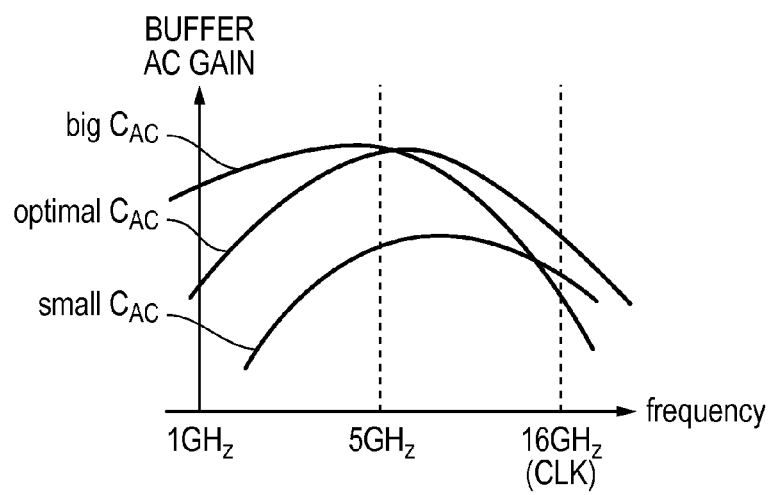
Figure 10:
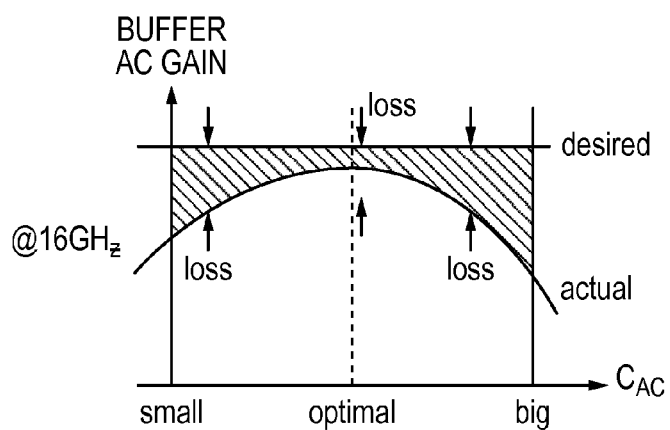
Figure 11:
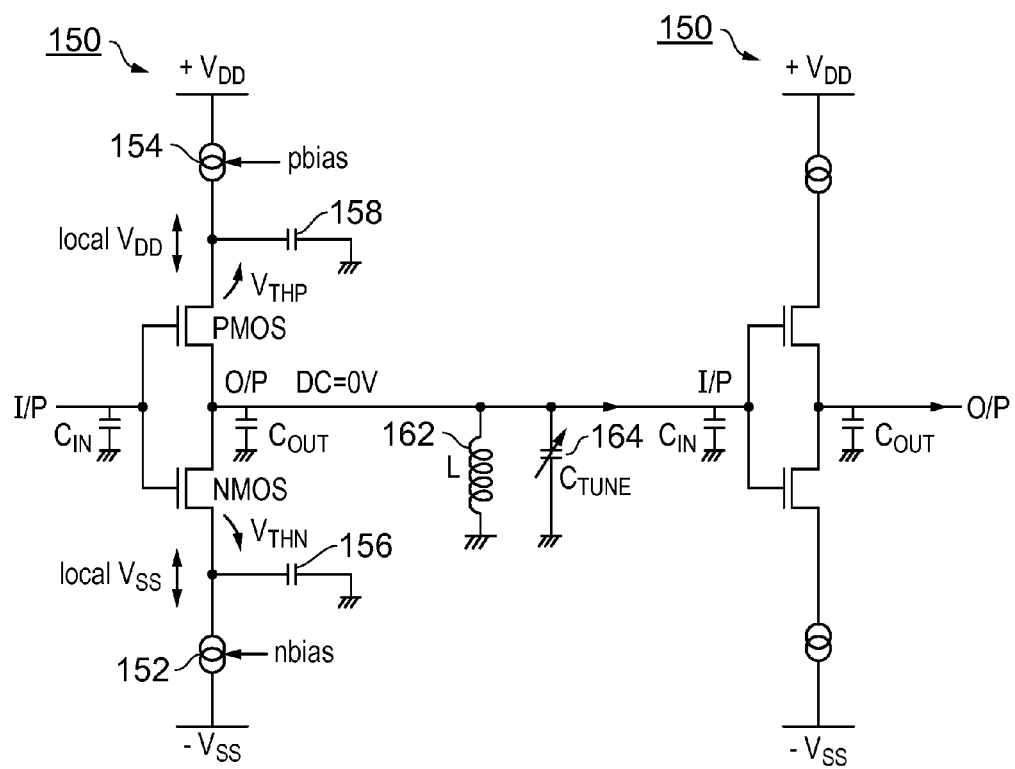
Figure 11:
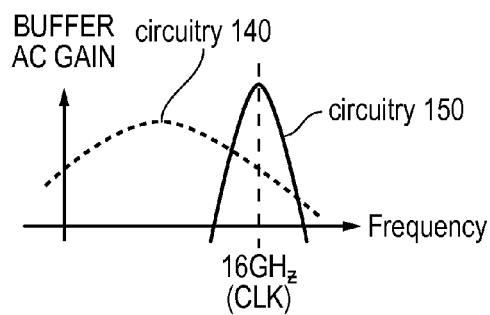
Figure 12:
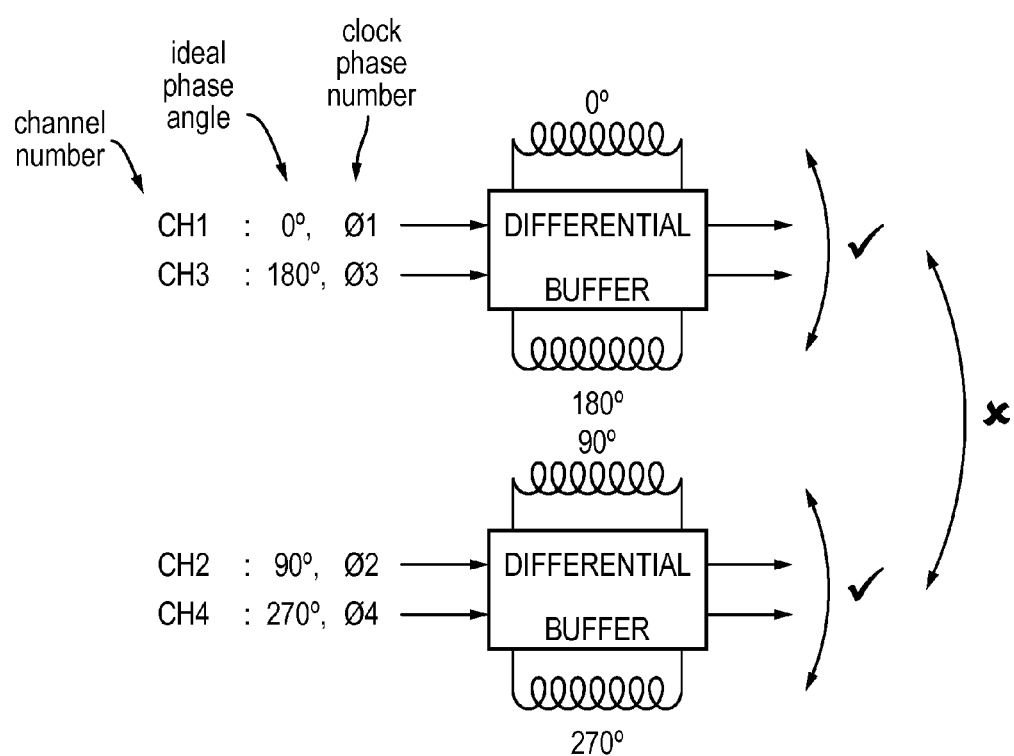
Figure 13A:
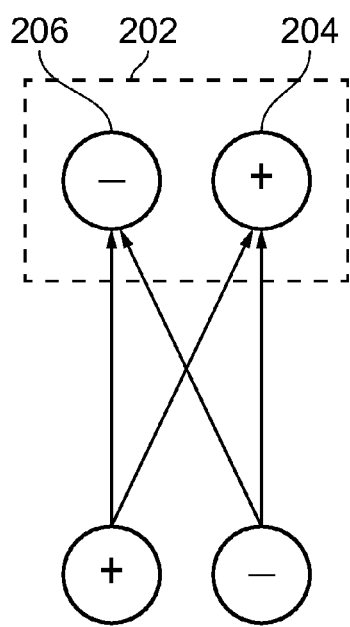
Figure 13B:
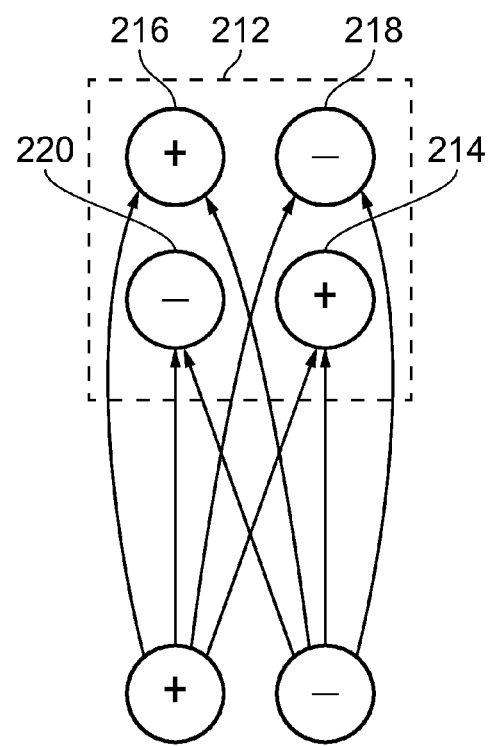
Figure 14A:
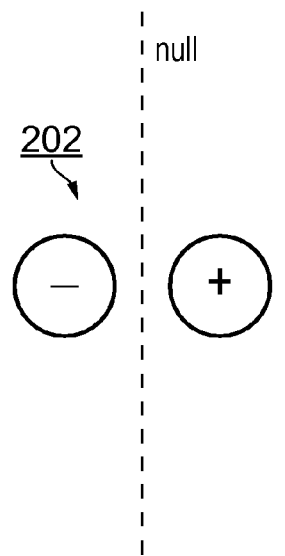
Figure 17:
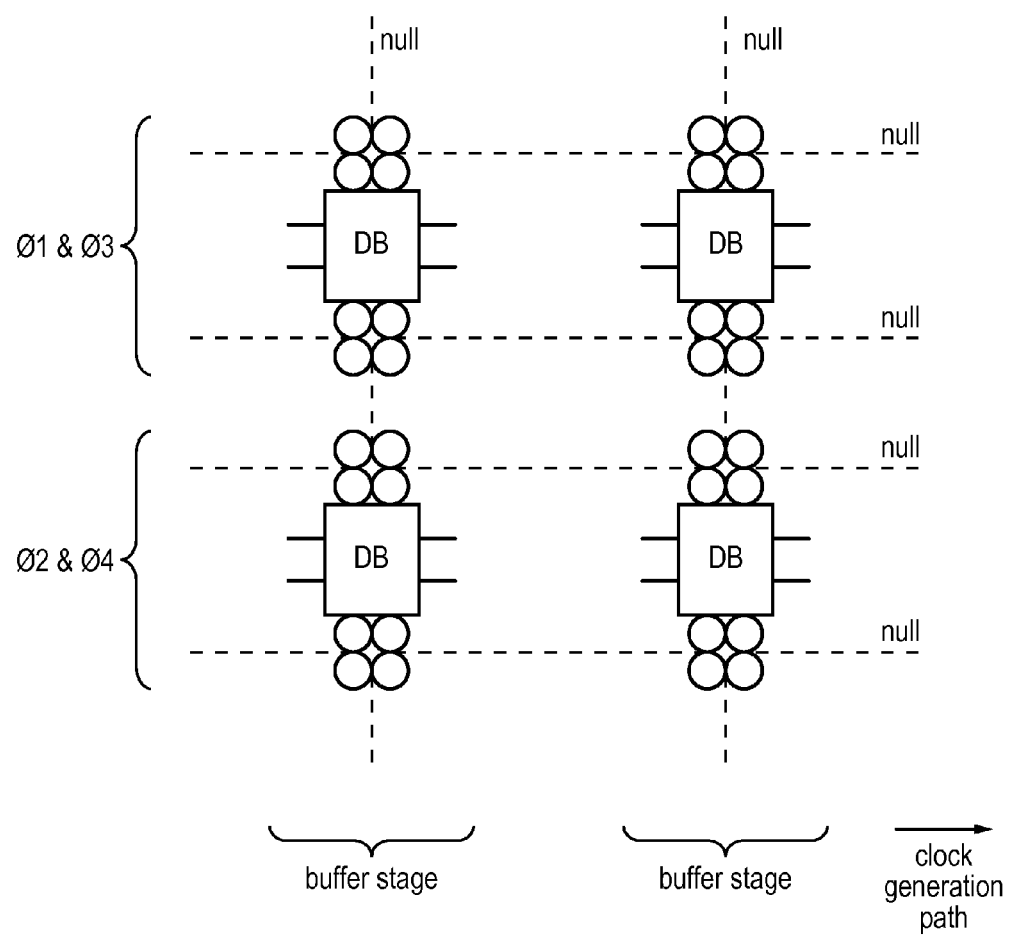
Figure 18:
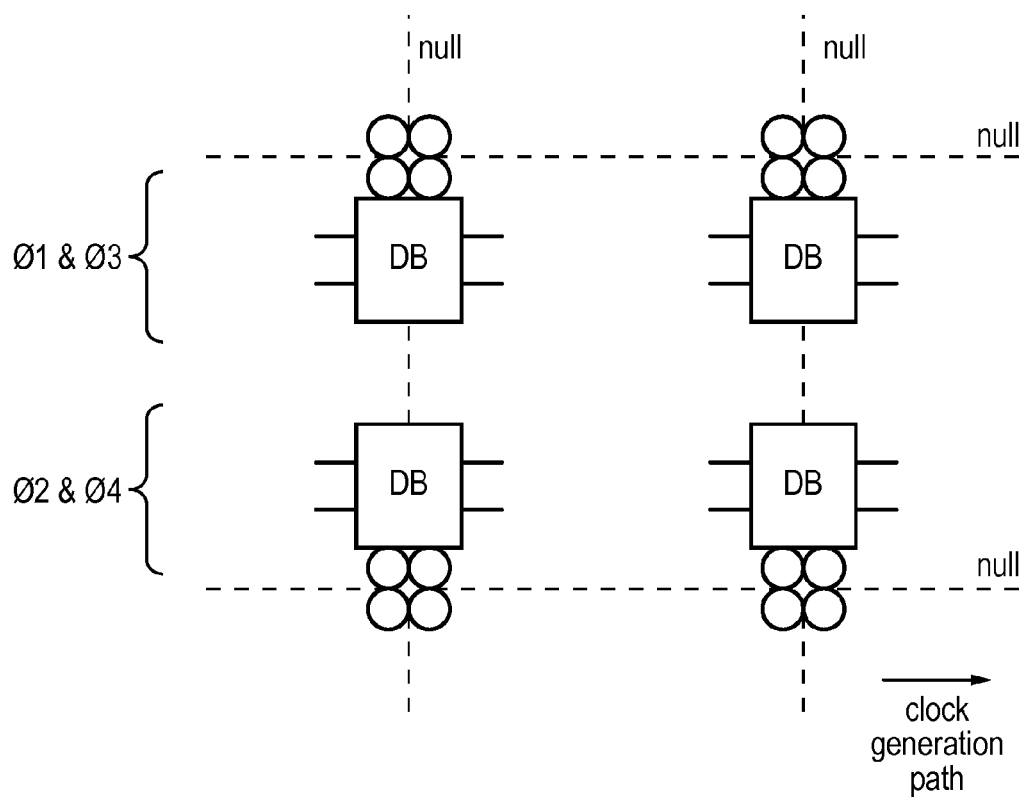

FIGS. 9(*a*) and 9(*b*) are schematic diagrams presenting respective sets of buffer circuitry for comparison with one another and with the circuitry of FIG. 8B;

FIG. 10 is a schematic diagram presenting buffer circuitry equivalent to that of FIG. 8B, and graphs useful for understanding its operation;

FIG. 11 is a schematic diagram presenting buffer circuitry embodying the present invention, and a graph useful for understanding its operation;

FIG. 12 is a schematic diagram demonstrating that the buffers of the buffer stages disclosed herein may be implemented by way of differential buffers, and is provided to further consider the impact of inductors of those buffers;

FIGS. 13(*a*) and 13(*b*) are schematic diagrams presenting respective different inductor configurations;

FIGS. 14(*a*) and 14(*b*) are schematic diagrams indicating null lines of the inductor configurations of FIGS. 13(*a*) and 13(*b*), respectively;

FIGS. 15(*a*)-15(*d*) contain a schematic diagram presenting four possible implementations of the inductor configuration of FIG. 13(*b*);

FIGS. 16(*a*)-16(*d*) contain a schematic diagram presenting four possible implementations of an inductor of the inductor configuration of FIG. 13(*b*);

FIG. 17 is a schematic diagram indicating how differential buffer stages could be provided one after the other along a clock generation path, with each differential buffer having for example two inductor configurations as in FIG. 13(b); and FIG. 18 is a schematic diagram indicating how differential buffer stages could be provided one after the other along a clock generation path, with each differential buffer having for example one inductor configuration as in FIG. 13(b).

The present inventors have considered how to improve control of buffer circuitry and mitigate mismatch-related issues. In particular, it has been recognised that in buffers 102 implemented as buffer circuitry 120 of FIG. 6, the threshold voltages $V_{TH}$ of the two transistors govern the bias/average current I that flows through them, which governs the switching delay.

Improved Matching by Current Control:

FIG. 8A presents buffer circuitry 120 again, in its upper portion. The same NMOS and PMOS field-effect transistors (FETs) are shown, and indicated as being susceptible to $V_{TH}$ variation. That is, the threshold voltages in one such buffer may be different from those in another such buffer. Also indicated is a current I (here, schematically representing an average or bias current), which flows through the two transistors during operation.

In the lower part of FIG. 8A, a parallel set 104 of buffers is indicated, where each buffer is implemented as buffer circuitry 120. Given the above $V_{TH}$ variation, across the 4 channels CH1 to CH4 the threshold voltages $V_{TH}$ may be different, and as such given constant $V_{DD}$, the currents I would be different giving different delays. This is indicated also in the lower part of FIG. 8A, alongside the parallel set 104 of buffers.

For example, the respective threshold voltages $V_{TH1}$ to $V_{TH4}$ for the channels CH1 to CH4 are indicated as being different from one another, by way of suffixes 1 to 4 corresponding to the channel numbers. Of course, there are two transistors per buffer, each transistor having its own threshold voltage, however for simplicity it is simply indicated that there is some difference in threshold voltage between the buffers. The entries for $V_{DD}$, I and Delay will be understood similarly (in terms of whether or not suffixes are shown) with reference to the circuitry 120 in the upper portion of FIG. 8A. Essentially, given the threshold variation represented by threshold voltages $V_{TH1}$ to $V_{TH4}$, the delays associated with the four buffers are substantially different (indicated by Delay1 to Delay 4).

Although it may be difficult/impossible to sufficiently match $V_{TH}$ across the channels (both within a process and across process, given practical manufacturing constraints), it is possible to match the currents I to a high degree (as compared to $V_{TH}$ matching) and thereby attempt to closely match the delays.

FIG. 8B presents buffer circuitry 130 devised with this in mind. The basic CMOS inverter structure is the same as in circuitry 120 of FIG. 8A, except that the input and output are resistor-coupled with a resistance or resistor 132, and that the input is DC-decoupled from (or AC-coupled to) the preceding stage by way of a capacitor or capacitance 134, which may be referred to as an AC coupling capacitor $C_{AC}$.

Additionally, and importantly, a PMOS transistor 136 is provided between $V_{DD}$ and the PMOS transistor of the inverter, and controlled by a bias voltage Vbias to act as a current source. With the decoupling capacitor 138 as indicated, a local $V_{DD}$ is created for the CMOS inverter transistors, also as indicated. Given the resistor 132 and capacitor 134 connected as shown, the PMOS transistor 136 acting as a current source controls or defines the average or bias current flowing through both transistors of the CMOS inverter.

The current-source PMOS transistor 136 may be relatively large (as compared to the inverter transistors) and thus it is easier to match across the channels (in terms of $V_{TH}$). That is, the threshold voltages $V_{TH}$ of the current-source PMOS transistor 136 may be matched to a much higher degree across different buffers 130 than the PMOS and NMOS transistors of the inverter portion itself. Therefore, even with a common Vbias across the channels (as opposed to an individual Vbias per channel), it is possible to match the bias current Ibias from the current source across the channels to a high or sufficient degree. Of course, an individual Vbias per channel could be provided.

In the lower part of FIG. 8B (in a similar way as to in FIG. 8A), a parallel set 104 of buffers is indicated, where each buffer is implemented as buffer circuitry 130. Even with the above $V_{TH}$ variation in the inverter transistors across the 4 channels CH1 to CH4, such that the indicated threshold voltages $V_{TH}$ are different as in FIG. 8A, Ibias may be the same across the channels (with the effect of differences in local $V_{DD}$ across the channels) and as such also the delay. This is indicated also in the lower part of FIG. 8A, alongside the parallel set 104 of buffers.

For example, the respective threshold voltages $V_{TH1}$ to $V_{TH4}$ for the channels CH1 to CH4 are indicated as being different from one another, by way of suffixes 1 to 4 corresponding to the channel numbers, as in FIG. 8A. The entries for local $V_{DD}$, Ibias and Delay will be understood similarly with reference to the circuitry 130 in the upper portion of FIG. 8B. Essentially, even with the threshold voltage variation represented by threshold voltages $V_{TH1}$ to $V_{TH4}$, the currents (Ibias) and the delays (Delay) associated with the four buffers are substantially matched, or approximately the same (indicated by the entries Ibias and Delay being the same for all channels).

This technique has been found to greatly improve the matching between buffers across the channels. In effect, the performance of the buffer circuitry 130 is largely independent of threshold voltage variation in the relatively small (i.e. tiny) inverter transistors.

For example, the PMOS current source (current-control device, current-control switch) provided in FIG. 8B individually defines the average or bias currents of both transistors (signal-path switches) of the CMOS inverter. The average or bias currents of both transistors of the CMOS inverter are defined substantially independently of: (a) the threshold voltages of those transistors; (b) differences between those threshold voltages, and/or (c) differences between those threshold voltages and corresponding reference threshold voltages (for example, expected ideal/target threshold voltages).

Figure 9A:
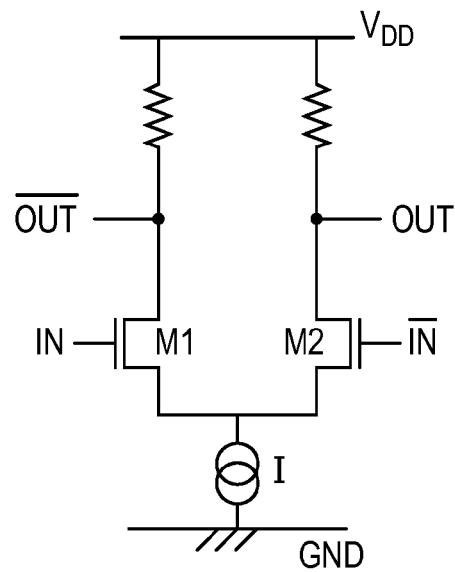
Figure 9B:
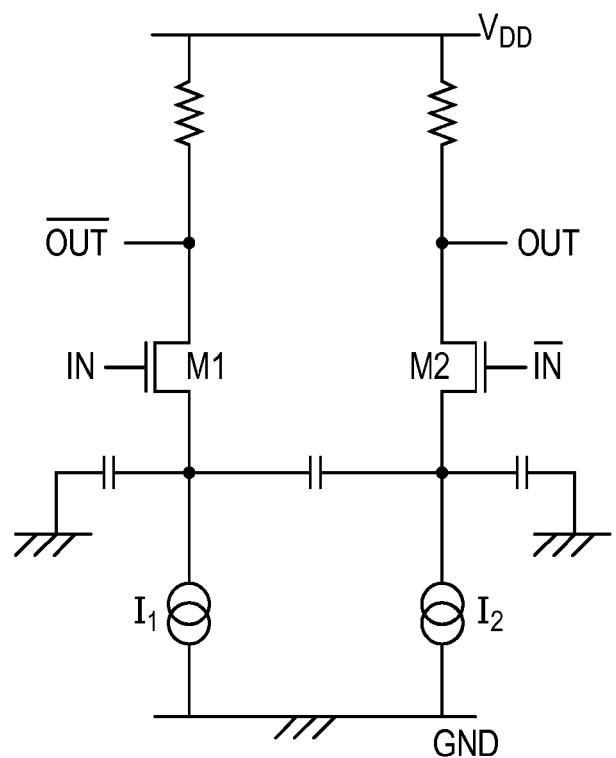

FIGS. 9(a) and 9(b) present respective sets of buffer circuitry, to indicate that the inverter arrangement in circuitry 130 is not essential. That is, the inverter arrangement may be considered one example of a switching arrangement comprising at least one signal-path switch configured to switch in dependence upon an input signal, where the switching performance of the buffer circuitry is dependent on a bias current flowing through the or each signal-path switch of the switching arrangement. Similarly, the current source 136 may be considered one example of a current-control arrangement connected to the switching arrangement and configured to control the bias current flowing through the or each signal-path switch so as to control the switching performance of the buffer circuitry.

The buffer circuitry of FIG. 9(a), which is provided as a comparative example, comprise transistors M1 and M2 (implemented here as NMOS transistors), each of which is connected via a resistance to the supply voltage $V_{DD}$ and which are together connected via a common current source to ground GND. M1 and M2 are connected to receive complementary input signals IN and $\overline{IN}$ and to output complementary output signals OUT and $\overline{OUT}$ as shown. Such circuitry may be referred to as a CML (Common-Mode Logic) buffer.

The switching delay is affected by the threshold voltage $V_{TH}$ of the transistors M1 and M2. Any threshold voltage difference between M1 and M2 means that the delay is different for rising and falling edges of the input signal IN. For example, if there is such threshold voltage mismatch, the current I from the current source does not split equally on average between the two transistors M1 and M2.

For high-speed switching, e.g. to carry high-speed clock signals, it would be desirable to reduce the size of transistors M1 and M2. However, as above, this would increase the likelihood and amount of threshold voltage mismatch between the two transistors.

The buffer circuitry of FIG. 9(b) is similar to that in FIG. 9(a), except that each transistor is provided with its own current source, such that transistor M1 has current source $I_1$ and transistor M2 has current source $I_2$. Further, the transistors are now decoupled from one another via a capacitance, with further capacitances coupling the nodes between the transistors and the current sources to ground GND, as shown. The value of these current sources could for example be set as $I_1=I_2=I/2$.

In FIG. 9(b), in contrast to FIG. 9(a), the two transistors M1 and M2 are provided with their own current sources, so that the (bias) current flowing through them may be set by matching the current sources $I_1$ and $I_2$. The current sources may be implemented as transistors having a large gate are relative to the sizes of M1 and M2 (which may be small for high-speed operation and thus have large threshold-voltage mismatch). As such, the current sources may be relatively well matched, rendering the FIG. 9(b) delay-matched buffer circuitry in line with the general principle of the present invention. Essentially, even with the threshold voltage variation between M1 and M2, the bias currents and the delays are substantially matched, or approximately the same. With this principle, good matching could be achieved between several sets of the FIG. 9(b) circuitry, whereas this may not be achieved in respect of the FIG. 9(a) circuitry.

FIG. 10 presents buffer circuitry 140 equivalent to circuitry 130 depicted in FIG. 8B, albeit in an "upside-down" form with the current source 142 corresponding to current source 136 provided below the CMOS inverter transistors. Also, the decoupling capacitor 138 is shown linking between the upper reference voltage (provided from a driver or amplifier 144) and a node between the CMOS inverter transistors and the current source 142.

The two graphs in FIG. 10 indicate how the performance (AC gain) of the buffer circuitry 140 is related to the AC coupling capacitor $C_{AC}$ 134 (bearing in mind that it has associated parasitic capacitances, e.g. including those associated with the tracking and the CMOS transistor gates).

In the upper graph, buffer AC gain over frequency is indicated for different sizes of $C_{AC}$, named relative to one another as "big", "optimal" and "small" for simplicity. As can be seen, the frequency response has been found to peak around 5 GHz as opposed to around the example clock frequency 16 GHz, giving suboptimal noise performance (or "noise peaking").

The lower graph gives a fuller picture of the effect of varying $C_{AC}$ at the example clock frequency 16 GHz, and as such represents a snapshot of the upper graph at the 16 GHz point. As indicated, the circuitry suffers from AC coupling gain loss, which varies with $C_{AC}$. That is, the ideal case ("desired") where gain is independent of the value of $C_{AC}$ is different from the "actual" case, where gain peaks at "optimal" $C_{AC}$. The loss is indicated as being represented by the shaded area between the "desired" (ideal) and "actual" cases.

Since it may be necessary in practice to turn the power up to compensate for AC coupling gain loss, the knock-on effect may be high power density and potentially "hot spots" in a circuitry implementation.

FIG. 11 presents modified buffer circuitry 150, intended to address the issues identified above in connection with FIG. 10. As compared with the buffer circuitry 140, in the buffer circuitry 150 the AC coupling capacitor 134 and input-to-output coupling resistor 132 are removed, and current sources 152 and 154 are provided for both the NMOS and PMOS transistors, respectively, with decoupling capacitors 156 and 158 as shown.

As such, separate nbias and pbias controls of the current sources 152 and 154 may be applied to account for variation in $V_{THN}$ (threshold voltage for the inverter NMOS transistor) and $V_{THP}$ (threshold voltage for the inverter PMOS transistor), respectively, creating a local $V_{DD}$ and a local $V_{SS}$ as shown. The current sources 152 and 154 may be implemented by way of field-effect transistors (which are large relative to the inverter transistors, for reasons of matching) in line with current source 136 of FIG. 8B, and the nbias and pbias controls may thus be understood as gate voltages for those field-effect transistors, one (nbias) associated with the current source for the inverter NMOS transistor and the other (pbias) associated with the current source for the inverter PMOS transistor.

In FIG. 11 two sets of buffer circuitry 150 are shown, one after the next, with only the left-hand buffer being fully labelled for simplicity. Thus, the output of the first buffer 150 becomes the input of the next buffer 150, in line with the buffer stage 100 of FIG. 6.

An inductor L 162 and variable capacitor $C_{TUNE}$ 164 are provided between the buffers 150, and $LC_{TUNE}$ may be tuned by way of $C_{TUNE}$ so that the buffer gain peaks at the example clock frequency 16 GHz, taking into account the parasitic capacitances $C_{IN}$ and $C_{OUT}$ as indicated in FIG. 11. These capacitances $C_{IN}$ and $C_{OUT}$ are parasitic, i.e. associated with the discrete circuit elements of buffers 150, and are not discrete components themselves.

In the lower portion of FIG. 11, buffer AC gain over frequency is indicated for the buffer circuitry 140 of FIG. 10 and for the buffer circuitry 150 of FIG. 11, to demonstrate that $LC_{TUNE}$ may be tuned in circuitry 150 by way of $C_{TUNE}$ so that the buffer gain peaks at the example clock frequency 16 GHz.

In circuitry 150, because there is no longer AC coupling between the buffers, there is no AC loss. $C_{TUNE}$ does not affect AC loss, it simply tunes the centre frequency.

Incidentally, in FIG. 11 of inductor 162 and capacitor 164 only one of them is shown as being tuneable. Of course, either or both of them could be tuneable. For example, inductors and/or capacitors could be switched in or out to adjust the value of $LC_{TUNE}$. Capacitor $C_{TUNE}$ 164 may be implemented for example as a varicap or a switched capacitor, or a combination of both. Inductor L 162 may be implemented as a switched inductor.

As mentioned before, the transistors forming the current sources 152 and 154 may be large (relative to the CMOS inverter transistors) and thus well matched. The nbias and pbias controls may accordingly be common across the 4 channels CH1 to CH4, matching the currents and thus the delays across the channels. The nbias and pbias controls may, in another embodiment, be separately provided.

Since the current sources 152 and 154 create local $V_{DD}$ and $V_{SS}$ for the buffer inverter, they effectively control the amplitude of the clock signals. Thus, amplitude level control (ALC) may be implemented by sensing the amplitude of the clock signals and controlling nbias and pbias accordingly. This could be done per channel or for all 4 channels in parallel. The choice as to whether to carry out such ALC per channel or in common for all channels depends on the accuracy/matching of the circuit that measures amplitude of the clock signals (Vpp) compared to the accuracy/matching of the circuit that sets the bias currents. If the measuring circuit is the more accurate of the two it may be better to have individual gain/bias adjustments (i.e. per channel). If, however, the measuring circuit mismatch is bigger than that of the circuit that sets the bias currents it may be better to control all bias currents together (i.e. in common across the channels).

It has been described above that delays may be matched between buffers by matching currents, since the circuit speed is defined by Ibias. Thus, although the high-speed small gates in the CMOS inverter may have substantial $V_{TH}$ mismatch ($\sigma_{VTH}$ may for example be approx. 50 mV for such high-speed transistors), good matching across the buffers is achieved. The current-source transistors have larger areas and thus matching is much better than for the high-speed transistors—enabling adoption of common Vbias across channels.

The present invention accordingly addresses the desire to provide <100 fs matching across buffers (1° at 16 GHz=174 fs). Since each channel might have e.g. 10 buffer stages in series, with four parallel channels, there may be 40+ buffers present in the overall clock generation path, e.g. within element 40 of FIG. 1. As such, the present invention has considerable advantages.

Incidentally, MOS transistor current matching does not depend on just gate area but also on the drain saturation voltage $V_{DSAT}$ (which roughly equals or is related to $V_{GS}-V_{TH}$, where $V_{GS}$ is the gate-source voltage and $V_{TH}$ is the threshold voltage). The drain saturation voltage $V_{DSAT}$ is the voltage beyond which the drain current is saturated, and for each gate voltage there is a different drain saturation voltage $V_{DSAT}$. As background, the part of the IV curve with $V_{DS}$ (the drain-source voltage)<<$V_{DSAT}$ is the linear region, and the part with $V_{DS}$>$V_{DSAT}$ is the saturation region. $V_{DS}$ and $V_{DSAT}$ may be thought of as equivalent to the voltage drop across the transistor device. The current mismatch between two such transistors is proportional to the difference in $V_{TH}$ divided by $V_{DSAT}$.

$V_{TH}$ mismatch is inversely proportional to gate area, so large gate area allows good $V_{TH}$ matching and high $V_{DSAT}$ allows good current matching. However high $V_{DSAT}$ (which gives good current matching) also means that the transistor gain is low and switching speed is slow, and high gate area means high capacitance which also means slow switching.

It may be useful to consider the following equations:

$V_{TH}$ mismatch=K/sqrt(area): K="Pelgrom coefficient", for example K=−5 mV→error 5 mV for 1 μm², 0.5 mV for 100 μm²

$V_{DSAT}$ is proportional to sqrt(L/W)—therefore increasing L by a factor of 10 (whilst keeping W constant)→increasing $V_{DSAT}$ by a factor of approximately 3.2 (sqrt10)

With this in mind, consider the following example:

To switch quickly, the switching transistors (e.g. those of the CMOS inverter considered above) need to be small (e.g. W=3 μm, L=0.03 μm, gate area=0.1 μm²) and have low $V_{DSAT}$ (e.g. 100 mV for W/L=100, L/W=0.01). With K=5 mV and 0.1 μm² area the $V_{TH}$ error would be 16 mV; with $V_{DSAT}$ of 100 mV this would give 16% current error.

The current-source transistors, in contrast, can be much bigger than the switching transistors, and have higher $V_{DSAT}$, because they are not in the high-speed signal path (i.e. they are not switched by the high-speed input signal, such as a clock or data signal). See, for example, the circuitry of FIGS. 8B and 10. Thus, in this example, the current-source transistors may be relatively big (e.g. W=10 μm, L=1 μm, gate area=10 μm²) and have relatively high $V_{DSAT}$ (e.g. 320 mV for W/L=10, L/W=0.1). With K=5 mV and 10 μm² area the $V_{TH}$ error would be about 1.6 mV (10× lower than for the switching transistors); with $V_{DSAT}$ of 320 mV this would give about 0.5% current error (32× lower than for the switching transistors).

Thus, in this example, the matching between the larger current-source transistors is far better than the matching between the smaller switching transistors. In this example, the gate area $A_{CS}$ of the current-source transistors is 100 times larger than the gate area $A_{SW}$ of the switching transistors. In practice, $A_{CS}$ may be 10 to 1000 times larger than $A_{SW}$. Further, in this example the channel length $L_{CS}$ of the current-source transistors is around 33 times larger than the channel length $L_{SW}$ of the switching transistors. In practice, $L_{CS}$ may be 10 to 100 times larger than $L_{SW}$. Further, in this example the channel width $W_{CS}$ of the current-source transistors is around 3.3 times larger than the channel width $W_{SW}$ of the switching transistors. In practice, $W_{CS}$ may be 1 to 10 times larger than $W_{SW}$. Transistor area (i.e. W*L) affects $V_{TH}$ matching (more area is better), and L/W affects $V_{DSAT}$ (higher is better), so it is generally much more effective to increase L as much as possible (while keeping $V_{DSAT}$ within reasonable limits) because this provides advantages in boh respects. For example, increasing just W generally has little or no effect on current matching because $V_{TH}$ mismatch and $V_{DSAT}$ both decrease together.

Improved Matching by Inductor Design:

Consideration will now be made of the implementation (e.g. layout on chip) of inductors suitable for use in the circuitry described herein.

A feature of the DAC and ADC circuitry described herein, in particular of the clock generation paths and buffers (buffer circuitry) for use with the DAC and ADC circuitry, is the requirement for a large number of inductors to be implemented in a small space (i.e. on chip). To understand this better, reference may be made back to, for example, FIG. 11 which shows an example buffer 150, and FIGS. 1, 6 and 7.

Figure 6:
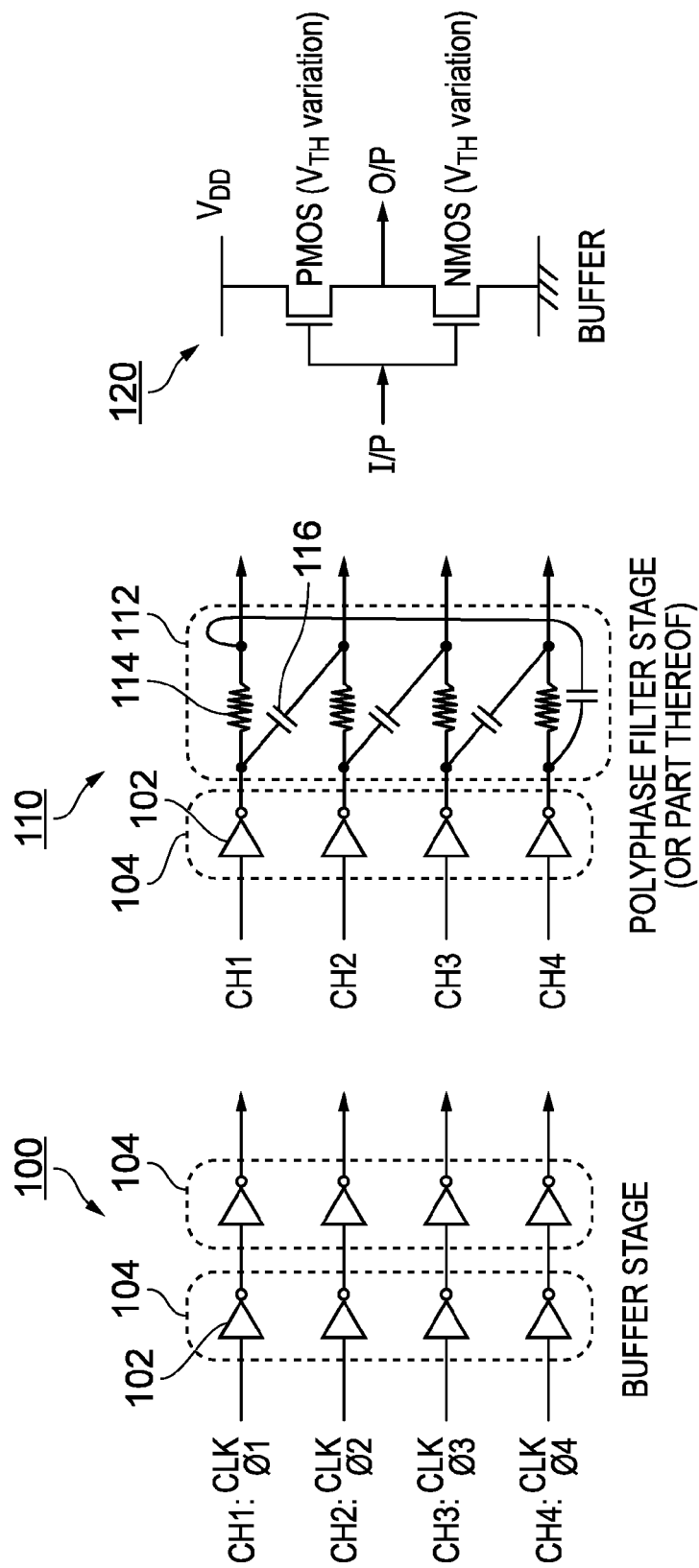
Figure 7:
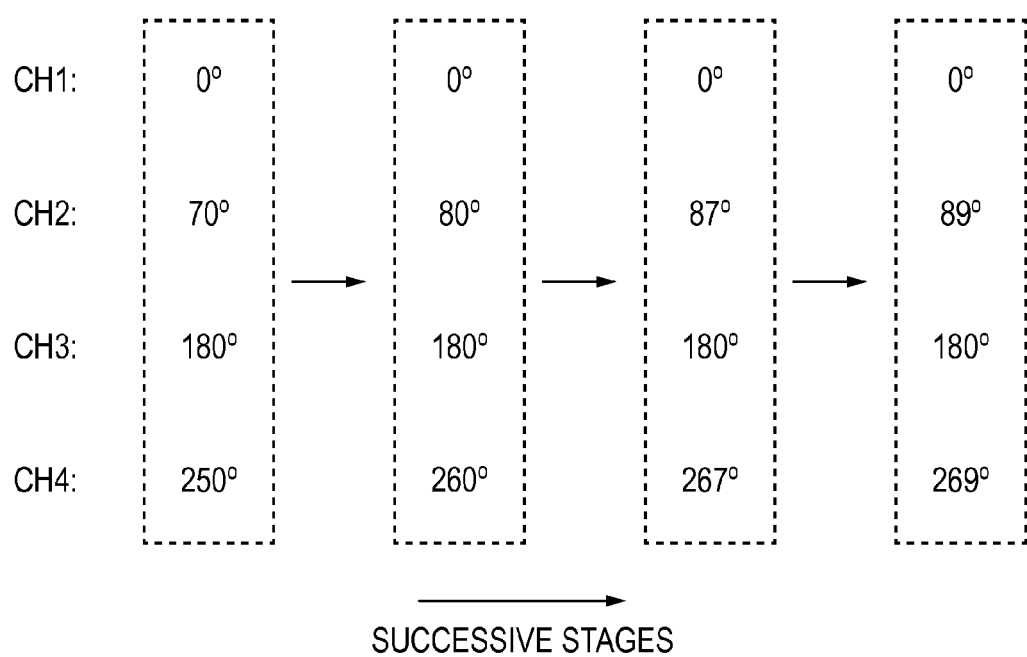

For example, in relation to FIGS. 6 and 7, it is clear that many buffer stages may occur along the clock generation and distribution path. Moreover, each buffer stage 100 comprises one or more buffers per channel. Each polyphase filter stage 110 may also comprise one or more sets 104 of buffers or such buffer stages 100. FIG. 7 indicates that several buffer/polyphase-filter stages may be provided in series to bring the four phases on the respective channels towards the ideal case.

Regarding FIG. 11, note the presence of the inductor 162 at the output of one buffer 150 and/or at the input of the next buffer 150. Such inductors may be connected to ground (GND) or a reference voltage such as VDD. They also may be connected between opposing channels (CH1 and CH3, or CH2 and CH4) if the buffers 150 are implemented as differential buffers.

Thus, looking at FIGS. 6 and 7, and taking into account FIG. 11, a large number of inductors (e.g. 32 or 48) may need to be provided in the clock distribution path. Additionally, such inductors may be provided for the separate channels CH1 to CH4 and thus be connected to different phases of Φ1 to Φ4. Magnetic coupling between the inductors gives rise to phase errors in the clock distribution circuitry which is highly undesirable. Recall from the discussion of FIGS. 6 and 7 the desire for better than 100 fs matching between channels.

FIG. 12 is a schematic diagram demonstrating that the buffers of the buffer stages may be implemented by way of differential buffers, and is provided to further consider the importance of the inductors. If the buffer stages were implemented with differential buffers, with clock phases Φ1 (0°) and Φ3 (180°) dealt with by one such buffer and Φ2 (90°) and Φ4 (270°) by another, it could be understood that the interaction between the inductors in each differential buffer might be acceptable (since they are out of phase with one another). However, interaction between the two differential buffers would likely be problematic and may give rise to phase errors (i.e. matching errors) between the channels.

Figure 1:
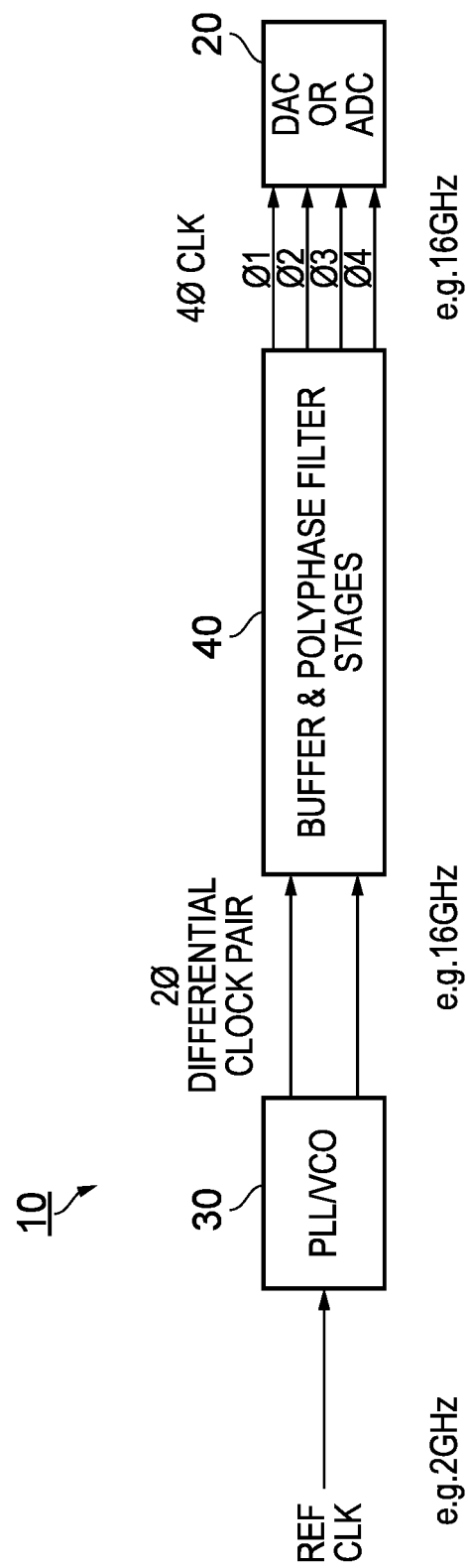

An additional consideration is that the paths/channels in the example circuitry of FIG. 1 must be connected together (e.g. via capacitors 116 in the RC network 112 of the polyphase filter stages 110 as in FIG. 6). Thus, for example, the option of distancing inductors from one another to deal with the potential magnetic coupling and phase errors (by way of isolation by distance) is not available in a practical embodiment in which the buffers disclosed herein (and thus inductors) are employed in clock generation and distribution paths as in FIG. 1. In fact, the sheer number of inductors involved also requires them to be implemented close to one another in practice.

This poses the problem of how to further reduce phase errors between channels, and based on the above study of the importance of the inductors and their potential contribution to such phase errors, how handle such a large number of inductors across several phases (i.e. Φ1 to Φ4) in close proximity.

Reference will now be made to FIG. 13, which schematically represents two different inductor configurations.

In FIG. 13(*a*), an inductor implementation 202 is provided, in which an inductor is implemented as a pair of inductors 204 and 206 having opposite phases.

A reasonable amount of noise (phase error) reduction can be obtained by implementing inductors as a pair having opposite phases, rather than as single inductors.

The inductors 204 and 206 are indicated as circles, with two opposing phases being indicated by "+" (PLUS) and "−" (MINUS), respectively, where PLUS and MINUS refer to the sign (DC current) or phase (AC current) of the magnetic field generated by currents through the inductors. It will be appreciated that the phases may be achieved by a combination of the direction of the turns of the inductor and the direction in which current flows through the inductor. It will also be understood that "PLUS" and "MINUS" are relative to one another, i.e. in antiphase or substantially 180° out of phase with one another.

Also shown in FIG. 13(*a*) is a second pair of inductors similar to 204 and 206, in the lower portion of the FIG. Arrows are then provided between the pairs to aid an explanation of interaction between the two pairs.

For example, as indicated by the arrows in FIG. 13(*a*), any interaction between the lower PLUS inductor and the upper PLUS inductor (of the pair) is compensated for largely by interaction between the lower PLUS inductor and the upper MINUS inductor (of the pair). A similar point could be made looking at interaction between the lower MINUS inductor and the pair of inductors, as indicated by the relevant arrows.

In FIG. 13(*b*), an inductor implementation 212 is provided in accordance with the present invention, in which an inductor is implemented as a group of four inductors 214, 216, 218 and 220, where two have the opposite phase from the other two, and where like phases are diagonally opposite from one another.

It has been recognised that far better noise (phase error) reduction (than with implementation 202) can be obtained by locating inductors having opposite phases in adjacent groups of four, where like phases are diagonally opposite from one another. This may be referred to as a "cross-quad" group, and such a group is indicated by implementation 212.

Again, also shown in FIG. 13 (*b*) is a further pair of inductors similar to 204 and 206, in the lower portion of the FIG. Arrows are then provided between the pair and the "cross-quad" group 212 to aid explanation of interaction therebetween.

For example, as indicated by the arrows in FIG. 13(*b*), the lower PLUS inductor interacts with each of the four inductors of the cross-quad group. As such, the effect of the cross-quad group 212 on the lower PLUS inductor is virtually non-existent, or at least very small, with the combination of the individual interactions (arrows) leading to substantial cancelation. A similar point could be made looking at the effect of the cross-quad group 212 on the lower MINUS inductor.

The four inductors of the cross-quad group may be considered to be arranged in a two-by-two arrangement on a 2D surface (a semiconductor chip), e.g. with two rows and two columns. The arrangement may be considered to be a 2D arrangement, i.e. on a surface or in practice on a semiconductor chip (although, as below, this may include implementations which take up more than one layer of the chip). The arrangement of the inductors has the appearance of a grid of dots (each dot being an inductor), the dots being regularly arranged. Such a grid may be considered to be based on "square" or "rectangular" cells. The arrangement may be considered to be a matrix or rectangular/square array of inductors, defining one or more rows and columns.

Although represented as circles in FIG. 13, the inductors may be implemented in practice as coils which may be planar and may have a spiral form, implemented in the metal layers (i.e. with metal tracking) of a semiconductor chip. Such spirals may be considered to be "generally" planar, in the sense that they may be implemented over more than one layer of the chip. For example, the spirals may have the appearance of planar spirals when the semiconductor chips is viewed in plan view (i.e. down through the layers from its upper surface), with the different layers superimposed on one another. Of course, parts of the coils occupying different such layers may overlap when the chip is viewed in plan view (e.g. as in a helical coil). Such coils may have one or more turns.

FIGS. 14(*a*) and 14(*b*) present the pair 202 and cross-quad group 212 again, to further indicate a benefit of the cross-quad group 212 as compared to the pair 202.

As indicated in FIG. 14(*a*), the pair 202 (when considered as an electromagnetic transmitter or receiver) has a null running vertically between the two inductors. The cross-quad group 212 however has two nulls, one running vertically through the middle of the group and the other horizontally through the middle of the group. Thus, the cross-quad group 212 offers more potential locations (i.e. along the nulls) where other inductors could be located for reduced interaction therebetween.

Figure 14B:
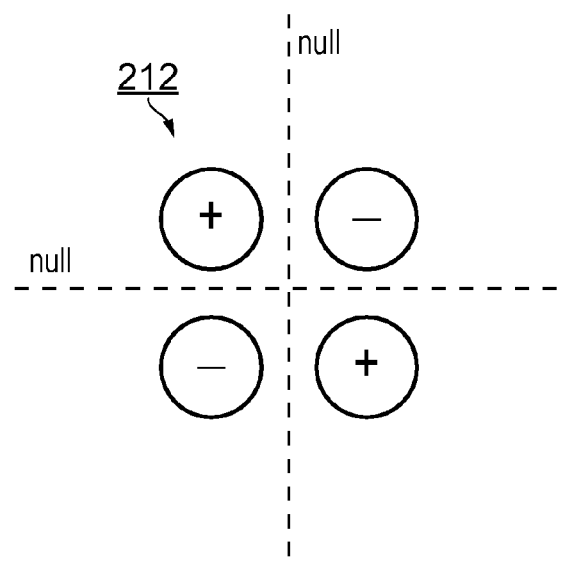
Figure 15A:
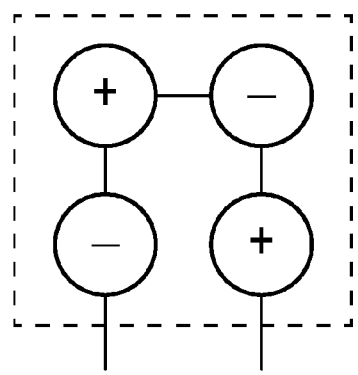
Figure 15B:
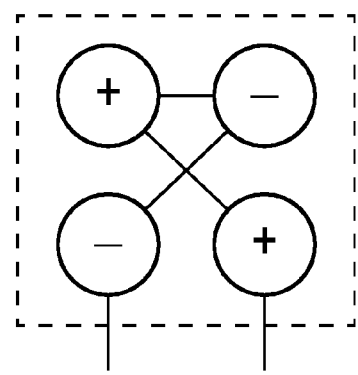
Figure 15C:
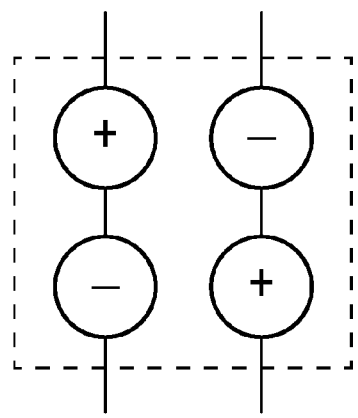
Figure 15D:
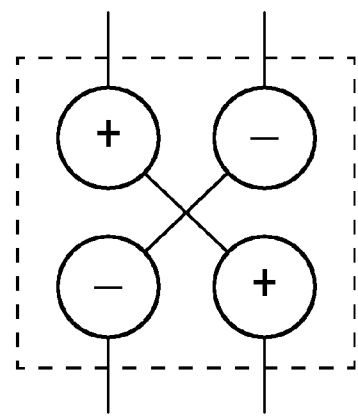
Figure 16A:
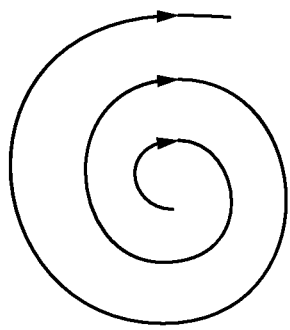
Figure 16C:
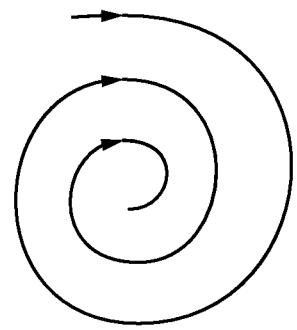
Figure 16B:
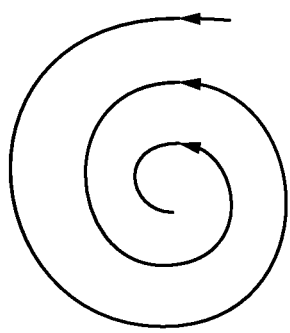
Figure 16D:
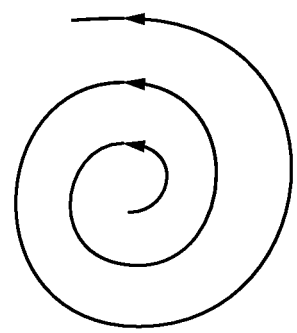

Considering FIGS. 13(b) and 14(b), the arrangement of the cross-quad group is such that it has only a small (i.e. negligible) interaction on any adjacent inductor, regardless of the phase carried by that adjacent inductor. This would be true even with reasonable—i.e. close—spacing between inductor quad groups. In effect the group has little or no effect on its surroundings.

Thus, although the phases of the lower inductors in FIG. 13(b) are the same as phases of the cross-quad group, the group would also have only a small interaction with inductors having other phases. For example, if the cross-quad group were to carry phases Φ1 (0°) and Φ3 (180°), it would have only a small interaction with an adjacent inductor carrying phase Φ2 (90°) or Φ4 (270°), or only a small interaction with an adjacent cross-quad group carrying phases Φ2 (90°) and Φ4 (270°).

By locating inductors or inductor groups relative to one another along nulls as in FIG. 14, for example so that their nulls align, better isolation is achieved than if they were to be located without aligning the nulls.

Incidentally, the above discussion focuses on electromagnetic (i.e. magnetic) coupling. Capacitive coupling (E-field) reduces with distance D having a 1/D relationship and can be greatly reduced further or almost eliminated by adding conductive metal shields in between circuits. On the other hand, magnetic coupling (H-field) reduces more slowly with distance D having a 1/[log D] relationship (see below), and shields are less effective because on-chip metals (e.g. aluminium, copper) have low permeability. Thus, for circuits spaced apart by a typical distance magnetic coupling is generally a much bigger problem than capacitive coupling, especially since it is more difficult to shield and falls off more slowly with distance.

FIGS. 15(a)-15(d) present four possible configurations of the cross-quad group of FIG. 13(b), and is provided to indicate that what is important in the cross-quad group is that the inductors of the group carry two opposite phases (i.e. in antiphase) and that like phases are diagonally opposite from one another. It is this, rather than any particular connections between the inductors of the group, which provides the desired effect. That is, the connections are made between the inductors having in mind the signals which will be applied in order to arrange for like phases to be diagonally opposite from one another. It will be appreciated that the direction of coil winding in each inductor can be either clockwise or anticlockwise, and that it is possible to connect the four inductors in different ways and to different phases of the clock generation circuitry. As such, FIGS. 15(a) to 15(d) simply show that many different topologies are available, and are not to be taken as showing the only available arrangements.

FIGS. 16(a)-16(d) present four possible configurations of an inductor of a cross-quad group, implemented as flat spiral. As above, the direction of coil winding in each inductor can be either clockwise or anticlockwise, and it is possible to connect an inductor in different ways and to different phases of the clock generation circuitry. As such, FIGS. 16(a) to 16(d) simply show how PLUS and MINUS phases for the inductors may be generated using a single input clock phase (e.g. Φ1). If the opposite clock phase (e.g. Φ3) were to be input instead, of course the PLUS and MINUS phases would be reversed in FIGS. 16(a)-16(d). Of course, PLUS and MINUS are phases relative to one another as mentioned above, as the field in each inductor alternates over time with the input sinusoidal clock signals.

Incidentally, although a cross-quad group of inductors as in FIG. 13(b) provides a significant improvement over providing simply pairs as in FIG. 13(a), it is also considered that most of the available benefit has been obtained with the cross-quad group and that the using groups with higher numbers of inductors may be less preferable in practice.

For example, the magnetic coupling may be considered as:

Single: $1/\log(D)$
Pair: $1/\log(D) \cdot D$
Cross-quad: $1/\log(D) \cdot D^2$
Next-larger group: $1/\log(D) \cdot D^3$
where D is distance.

That is, it is considered not worthwhile in practice to provide larger inductor groups than the cross-quad group since the overall circuitry size would need to increase every time an inductor is divided into two ($L \propto N^2$, where L is inductance and N is the number of turns).

Incidentally, the next number of inductors which could form a group with a similar effect beyond 4 is realistically 16. By way of explanation, the number should be even for PLUS and MINUS to give acceptable cancellation; if each individual inductor (or the overall array) is rectangular, the next sizes up could be 6 or 8, but to get a real increase in isolation ($1/\log(D) \cdot D^3$ as above) a group of 16 would be the next step up. However, a group of 4 (cross-quad group) is a preferred embodiment. Of course, a cross-quad group embodying the present invention may form part of a larger group of inductors (e.g. a group of 16), so that such a larger group embodies the present invention.

FIG. 17 indicates schematically how differential buffer stages DB could be provided one after the other along the clock generation path, with each differential buffer having for example two cross-quad groups of inductors. Only two successive buffer stages are shown, however many may be provided.

In FIG. 17, each cross-quad group is represented by a group of four circles in a similar manner as in FIG. 13(b), and as such each differential buffer stage DB is shown having one cross-quad group below it and one above it. Given that the buffers here are differential buffers, the upper buffer stages are shown handling (opposing) phases Φ1 and Φ3, and the lower stages are shown handling (opposing) phases Φ2 and Φ4.

FIG. 18 also indicates schematically how differential buffer stages DB could be provided one after the other along the clock generation path, but with each differential buffer having for example one cross-quad group of inductors. For example, the circuitry laid out as in FIG. 17 may be difficult to implement, given the need for connections between the phases in PPFs as mentioned earlier (see for example network 112 in FIG. 6). In FIG. 18, the two differential buffers in each stage are adjacently located, with the cross-quad groups arranged towards the outside of the pair of differential buffers. For example, a cross-quad group carrying phases Φ1 and Φ3 is shown at the top, then the Φ1/Φ3 differential buffer, then the Φ2/Φ4 differential buffer, and then a cross-quad group carrying phases Φ2 and Φ4 at the bottom. PPF connections may then be made between the central differential buffers.

In both FIGS. 17 and 18, null lines are presented in dashed form in line with FIG. 14(b), to demonstrate that the cross-quad groups are arranged with their nulls aligned.

Figure 2:
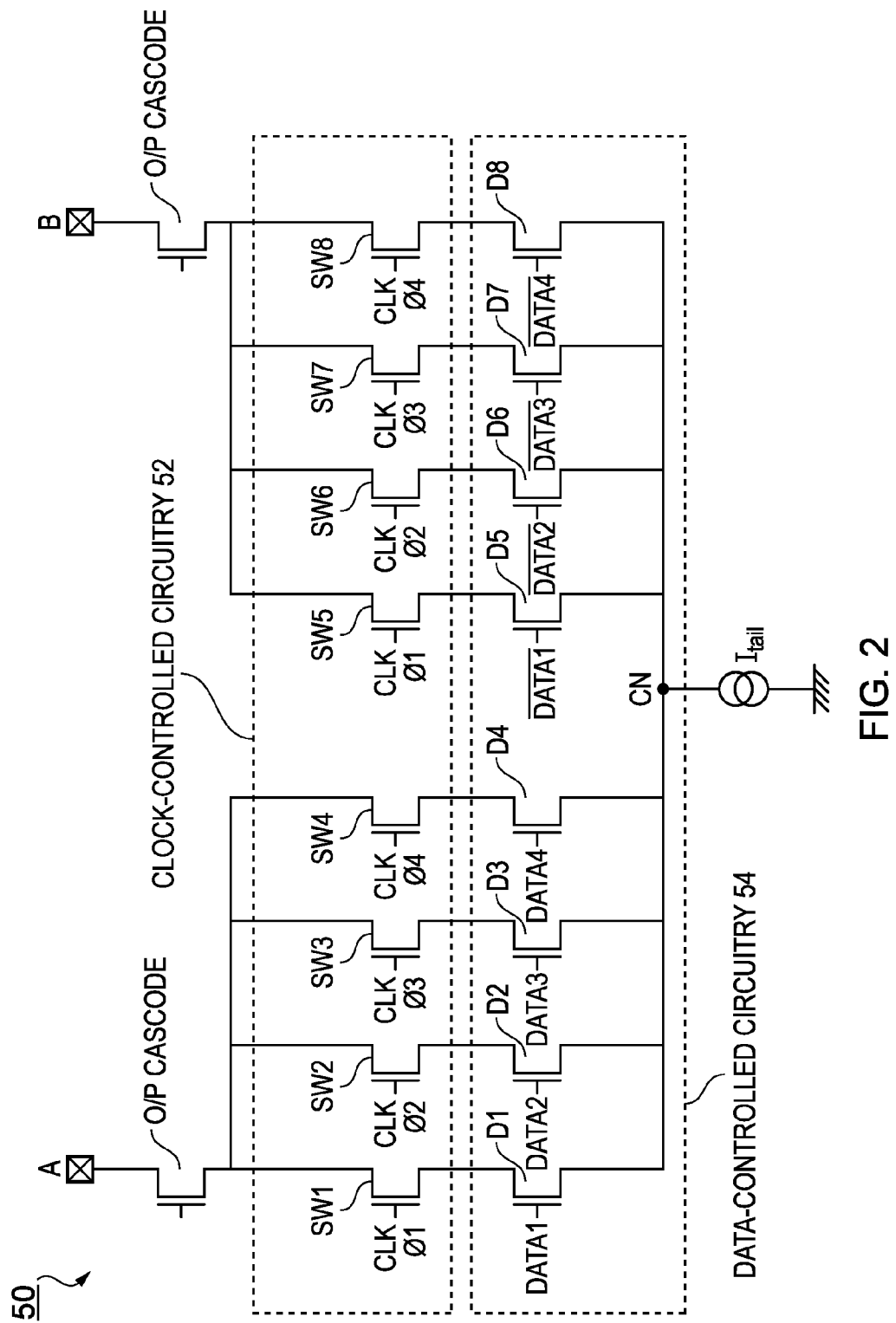
Figure 3:
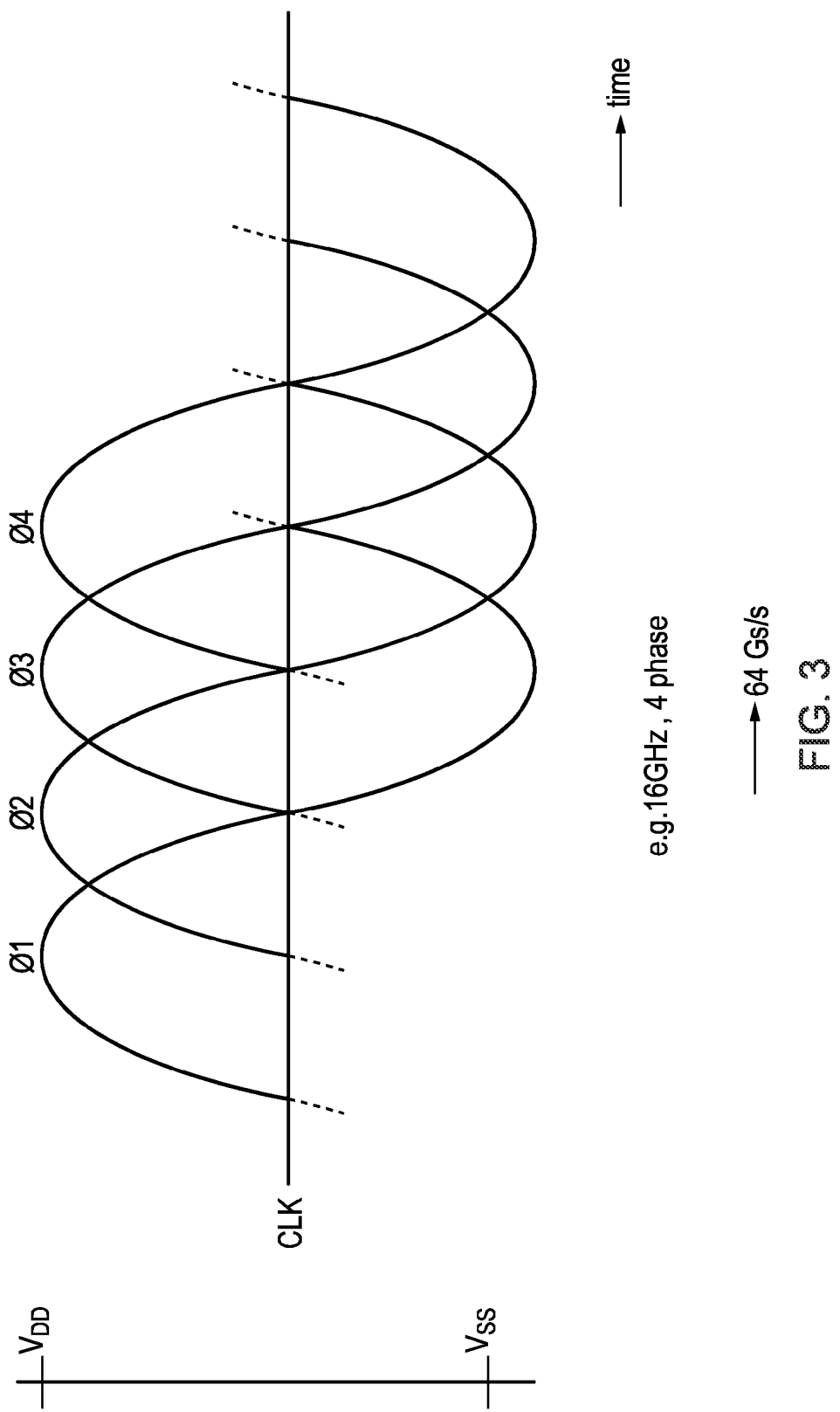
Figure 4:
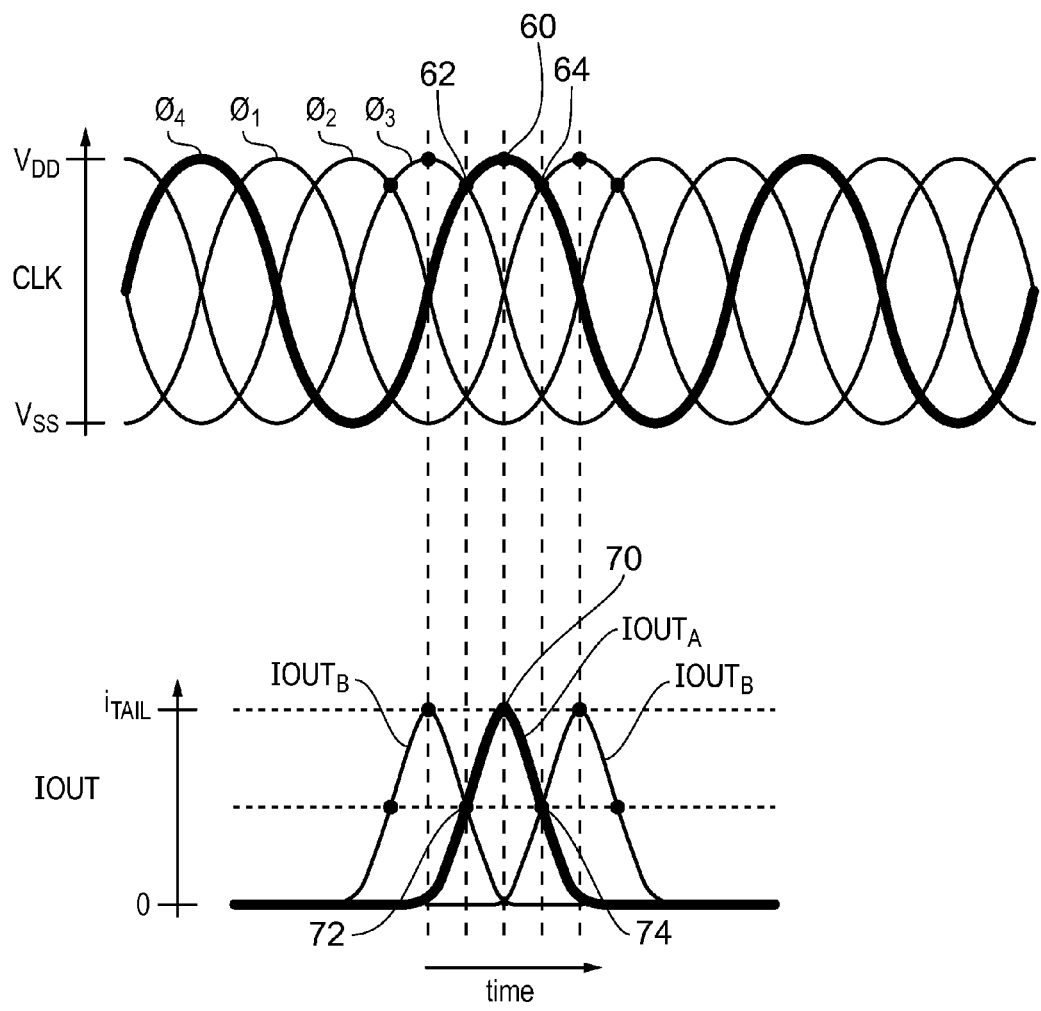
Figure 5:
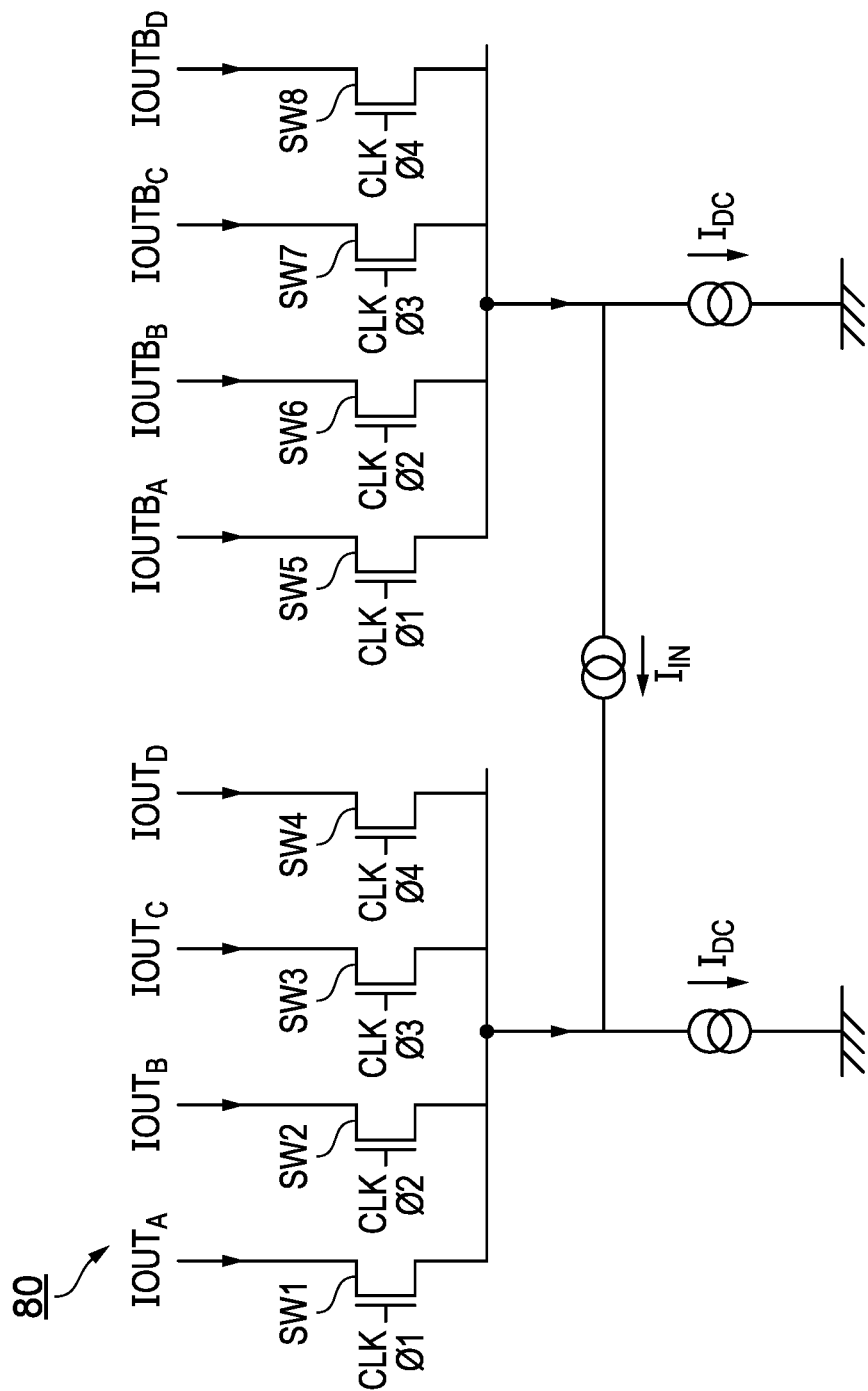

It will be appreciated that if 48 inductors (as might be required in the circuitry of FIG. 1) were each divided into a cross-quad group, almost 200 inductors (192) would be needed. The area that this could take up on chip in practice may be around 1 mm² in current IC processes, representing a significant portion of the overall circuitry for example when implementing DAC and/or ADC circuitry in line with FIGS. 2 and 5. Indeed, the inductor area may be bigger than that of the other circuits (buffers, resistors, capacitors) added together. However, the saving provided by the present invention as compared to conventional inductors may be very significant; for example, if conventional inductors need 2×/3×/4× spacing to reduce coupling between those inductors, circuit area with conventional inductors could be up to 4×/9×/16× larger.

The present disclosure extends to buffer circuitry in accordance with the present invention and an inductor arrangement in accordance with the present invention in combination. For example, the inductor 162 in the circuitry 150 may be implemented as (or part of) a cross-quad group of inductors as described above.

Circuitry of the present invention may from part of an analogue-to-digital converter. Circuitry of the present invention may be implemented as integrated circuitry, for example on an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many other different forms, within the scope of the appended claims.

The invention claimed is:

1. An integrated circuit comprising:
   first and second inductor arrangements; and
   buffer circuitry adapted to receive and buffer four clock signals being the four phases of a four-phase clock signal,
   wherein:
   each said inductor arrangement comprises four inductors adjacently located in a group and arranged to define two rows and two columns;
   the integrated circuit is configured, for each said inductor arrangement, to cause two of the four inductors which are diagonally opposite from one another in that arrangement to produce an electromagnetic field having a first phase, and to cause the other two of those four inductors to produce an electromagnetic field having a second phase, the first and second phases being substantially in antiphase; and
   the first and second inductor arrangements are connected to the buffer circuitry such that the electromagnetic fields of the first and second inductor arrangements are generated from respective said clock signals whereby the first and second phases of the first inductor arrangement are substantially in quadrature with the first and second phases, respectively, of the second inductor arrangement.

2. The integrated circuit as claimed in claim 1, further comprising one or more layers, wherein each said inductor is formed in only one said layer or across a plurality of said layers.

3. The integrated circuit as claimed in claim 1, wherein:
   the inductors each have one or more turns, and are optionally spiral inductors; or the inductors have the same size and number of turns as one another.

4. The integrated circuit as claimed in claim 3, wherein:
   the direction of the turns of the inductors is configured so that the inductors produce respective electromagnetic fields; or
   the inductors are connected to other circuitry of the integrated circuit or to each other so that the inductors produce respective electromagnetic fields.

5. The integrated circuit as claimed in claim 1, wherein the inductors each have a center and a diameter, and wherein a spacing between the centers of the inductors of each said inductor arrangement is Z times the diameter of at least one of the inductors, where $1 \leq Z \leq 50$, and preferably where $1 \leq Z \leq 10$.

6. The integrated circuit as claimed in claim 1, wherein:
   each said inductor arrangement comprises sixteen inductors including said four inductors;
   the inductors of each said inductor arrangement are arranged to define four rows and four columns;
   the inductors are configured so that each of them produces an electromagnetic field having the first phase or the second phase of the inductor arrangement; and
   for each said inductor arrangement, diagonally opposite inductors of any adjacent group of four of said sixteen inductors spanning two rows and two columns produce electromagnetic fields having the same said phase as one another.

7. The integrated circuit as claimed in claim 1, wherein said electromagnetic fields are fluctuating or alternating fields.

8. The integrated circuit as claimed in claim 1, wherein the inductors of each said inductor arrangement are connected together to form a single inductor or two separate inductors.

9. The integrated circuit as claimed in claim 1, wherein:
   each said inductor arrangement defines associated null lines along which an effective electromagnetic field of each said inductor arrangement has zero or negligible field strength; and
   the first and second inductor arrangements are each located such that one of the null lines of the first inductor arrangement is substantially aligned with one of the null lines of the second inductor arrangement.

10. The integrated circuit as claimed in claim 1, wherein:
    the first and second inductor arrangements and the buffer circuitry form a first clock distribution unit, said four clock signals being a first set of four clock signals;
    the integrated circuit comprises a second said clock distribution unit, adapted to receive and buffer a second set of four clock signals; and
    the first and second clock distribution units are connected such that a set of clock signals output by the buffer circuitry of the first clock distribution unit, which are generated by the buffer circuitry of the first clock distribution unit receiving and buffering the first set of four clock signals, are the second set of four clock signals which are received by the buffer circuitry of the second clock distribution unit.

11. The integrated circuit as claimed in claim 10, wherein:
    each said inductor arrangement defines associated null lines along which an effective electromagnetic field of each said inductor arrangement has zero or negligible field strength;

the first and second inductor arrangements of the first clock distribution unit are each located such that one of the null lines of the first inductor arrangement of the first clock distribution unit is substantially aligned with one of the null lines of the second inductor arrangement of the first clock distribution unit;

the first inductor arrangements of the first and second clock distribution units are each located such that one of the null lines of the first inductor arrangement of the first clock distribution unit is substantially aligned with one of the null lines of the first inductor arrangement of the second clock distribution unit; and the second inductor arrangements of the first and second clock distribution units are each located such that one of the null lines of the second inductor arrangement of the first clock distribution unit is substantially aligned with one of the null lines of the second inductor arrangement of the second clock distribution unit.

12. The integrated circuit as claimed in claim 1, comprising analogue-to-digital converter circuitry or digital-to-analogue converter circuitry.

13. An IC chip comprising an integrated circuit as claimed in claim 1.

* * * * *